United States Patent
Meinke

(10) Patent No.: US 8,510,932 B2
(45) Date of Patent: Aug. 20, 2013

(54) METHOD OF REDUCING MULTIPOLE CONTENT IN A CONDUCTOR ASSEMBLY DURING MANUFACTURE

(75) Inventor: Rainer Meinke, Melbourne, FL (US)

(73) Assignee: Advanced Magnet Lab, Inc., West Palm, FL (US)

(*) Notice: Subject to any disclaimer, the term of this patent is extended or adjusted under 35 U.S.C. 154(b) by 0 days.

(21) Appl. No.: 13/176,207

(22) Filed: Jul. 5, 2011

(65) Prior Publication Data
US 2011/0314661 A1 Dec. 29, 2011

Related U.S. Application Data

(62) Division of application No. 12/133,676, filed on Jun. 5, 2008, now Pat. No. 7,992,284.

(60) Provisional application No. 60/976,985, filed on Oct. 2, 2007.

(51) Int. Cl.
*H01F 7/06* (2006.01)

(52) U.S. Cl.
USPC ........... 29/605; 29/602.1; 29/606; 242/437.3; 242/437.4; 242/443; 242/445.1; 335/299; 336/212; 336/234; 445/1

(58) Field of Classification Search
USPC .................. 29/602.1, 604–606; 242/437.3, 242/437.4, 443, 445.1; 336/212, 234
See application file for complete search history.

(56) References Cited

U.S. PATENT DOCUMENTS

| | | |
|---|---|---|
| 3,197,680 A | 7/1965 | Wingerson |
| 3,761,752 A | 9/1973 | Anderson |

(Continued)

FOREIGN PATENT DOCUMENTS

| | | |
|---|---|---|
| CA | 968398 | 5/1975 |
| EP | 0353153 | 1/1990 |
| EP | 0954009 A | 11/1999 |
| FR | 2550026 A | 2/1985 |

OTHER PUBLICATIONS

R.B. Meinke, M.J. Ball, C.L. Goodzeit, "Superconducting Double-Helix Accelerator Magnets", IEEE Proceedings of the 2003 Particle Accelerator Conference, 2003, vol. 3, pp. 1996-1998.

(Continued)

*Primary Examiner* — Paul D Kim
(74) *Attorney, Agent, or Firm* — Ferdinand M. Romano; Beusse, Wolter, Sanks, Mora & Maire, P.A.

(57) ABSTRACT

A method for manufacture of a conductor assembly. The assembly is of the type which, when conducting current, generates a magnetic field or in which, in the presence of a changing magnetic field, a voltage is induced. In an example embodiment one or more first coil rows are formed. The assembly has multiple coil rows about an axis with outer coil rows formed about inner coil rows. A determination is made of deviations from specifications associated with the formed one or more first coil rows. One or more deviations correspond to a magnitude of a multipole field component which departs from a field specification. Based on the deviations, one or more wiring patterns are generated for one or more second coil rows to be formed about the one or more first coil rows. The one or more second coil rows are formed in the assembly. The magnitude of each multipole field component that departs from the field specification is offset.

6 Claims, 22 Drawing Sheets

(56) References Cited

U.S. PATENT DOCUMENTS

| | | |
|---|---|---|
| 4,283,687 A | 8/1981 | Madey |
| 4,639,708 A | 1/1987 | Weatherly |
| 4,992,766 A | 2/1991 | Suzuki |
| 6,921,042 B1 | 7/2005 | Goodziet |
| 6,989,673 B2 | 1/2006 | Zhu |
| 7,880,578 B2 * | 2/2011 | Meinke .................. 336/188 |
| 7,889,046 B2 * | 2/2011 | Meinke .................. 336/225 |
| 7,893,808 B2 * | 2/2011 | Meinke .................. 336/225 |
| 7,971,342 B2 * | 7/2011 | Meinke .................. 29/606 |
| 7,992,284 B2 * | 8/2011 | Meinke .................. 29/605 |
| 8,001,672 B2 * | 8/2011 | Meinke .................. 29/605 |
| 2003/0184427 A1 | 10/2003 | Gavrilin |

OTHER PUBLICATIONS

C.L. Goodzeit, R.B. Meinke, et al., "High Power Density Marine Propulsion Motors wish Double-Helix Coils"; Applied Superconductivity Conference, Aug. 27-Sep. 1, 2006, Seattle WA.

C.L. Goodzeit, et al, "The Double-Helix Dipole—A Novel Approach to Accelerator Magnet Design" Applied Superconductivity Conference, Aug. 4-Aug. 6, 2002.

Meinke, et al., "Modulated Double-Helix Quadrupole Magnets" ASC 2002 Paper 4LC08 Applied Superconductivity Conference, Aug. 4-Aug. 6, 2002.

* cited by examiner

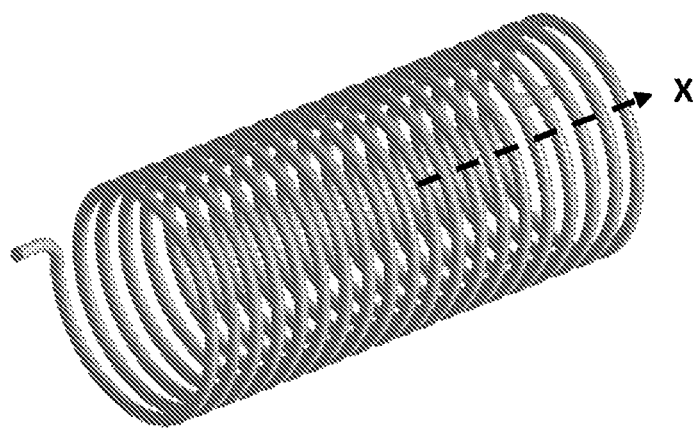
Figure 1A: (Prior Art)
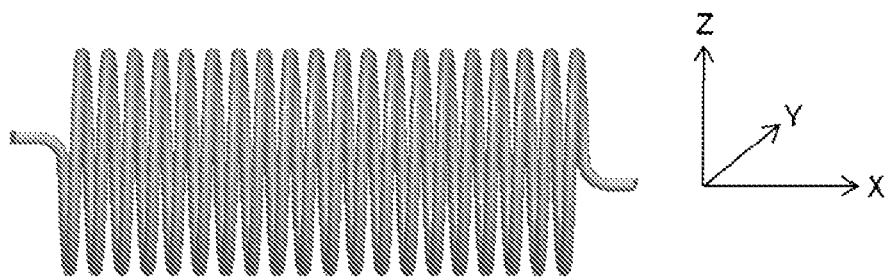
Figure 1B: (Prior Art)
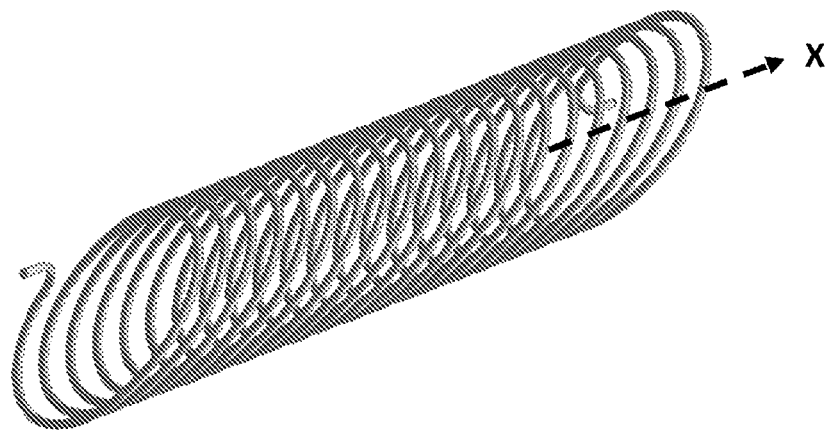
Figure 2: (Prior Art)

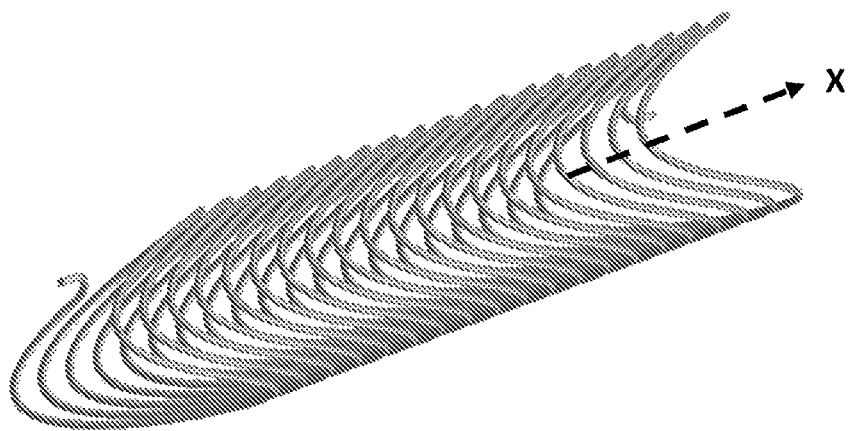
Figure 3: (Prior Art)
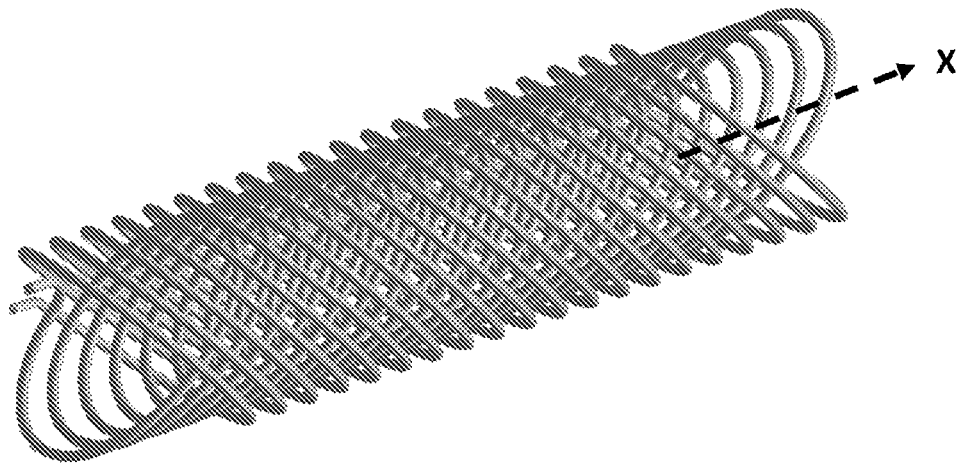
Figure 4: (Prior Art)

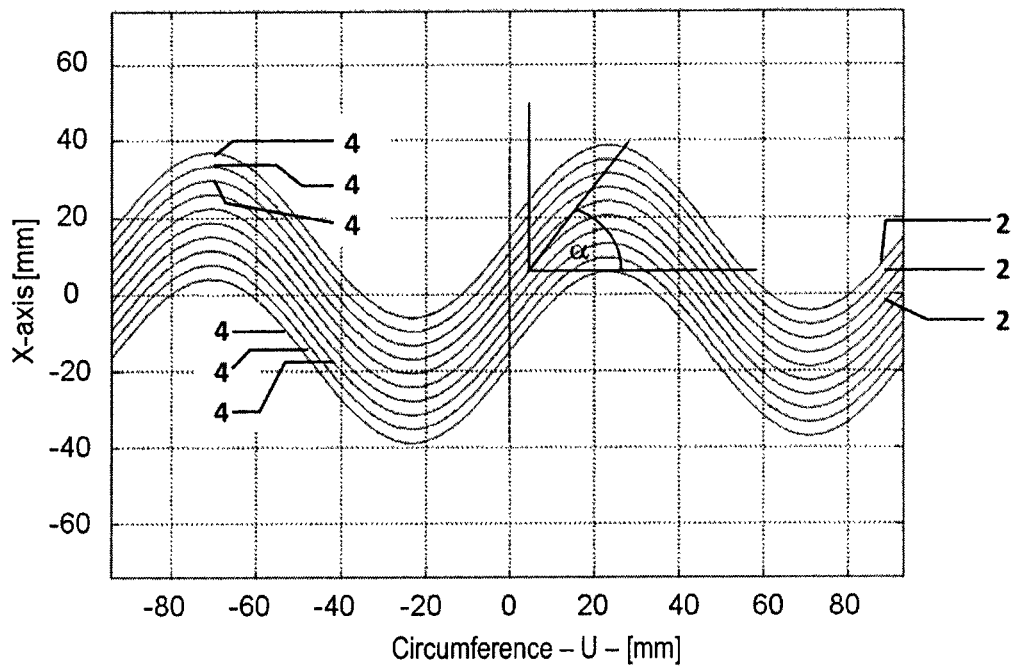
Figure 5: (Prior Art)
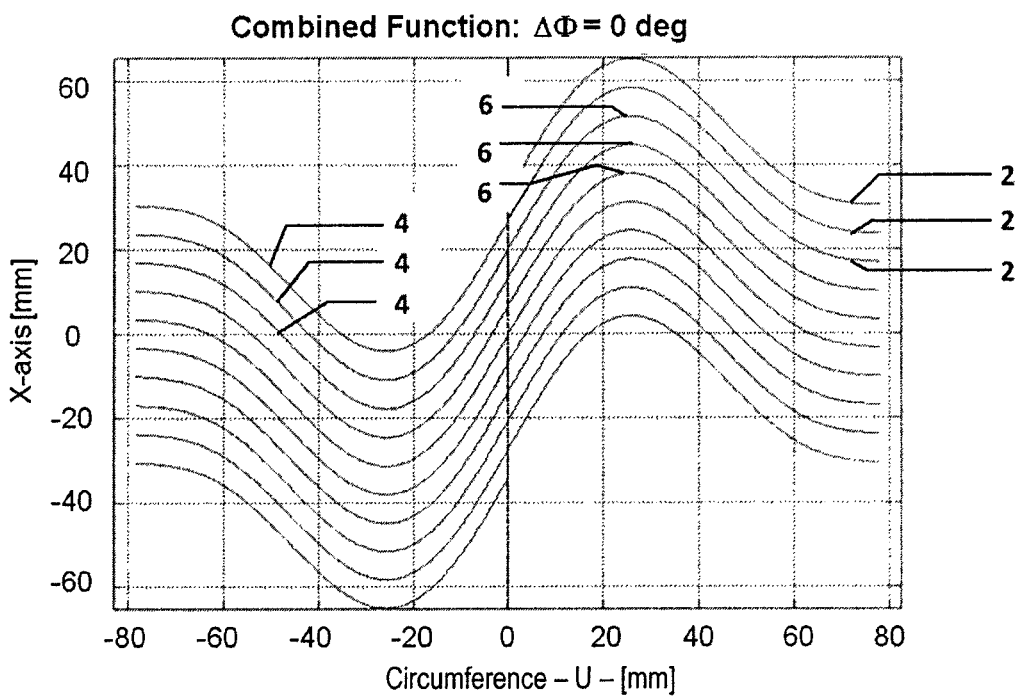
Figure 6: (Prior Art)

METHOD OF REDUCING MULTIPOLE CONTENT IN A CONDUCTOR ASSEMBLY DURING MANUFACTURE

RELATED APPLICATION

The invention of the present application is a Divisional of U.S. patent application Ser. No. 12/133,676, filed on 5 Jun. 2008, now U.S. Pat. No. 7,992,284, which claims priority to provisional patent application U.S. 60/976,985 filed 2 Oct. 2007 which is incorporated herein by reference in the entirety.

STATEMENT REGARDING FEDERALLY SPONSORED RESEARCH AND DEVELOPMENT

The United States Government may have certain rights in this invention pursuant to U.S. Government Contract Number DE-FG02-06ER84492 awarded by the United States Department of Energy.

FIELD OF THE INVENTION

This invention relates to electromagnetic systems which generate magnetic fields. More particularly, the invention relates to systems of the type including conductor assemblies which, when conducting current, generate a magnetic field or which, in the presence of a changing magnetic field, generate or transform voltages.

It is of continued importance across many sectors of the world economy (e.g., R&D, and medical applications) to achieve improved performance in magnetic conductor assemblies. Development of new and improved commercial applications is dependent on an ability to create large and uniform magnetic fields. Advancements are also needed in numerous performance and reliability factors to realize commercially useful embodiments in medical, industrial and commercial applications. For example, it is desirable to make charged particle therapy cancer treatment (e.g., proton and carbon therapy) more available to patients, but these systems require cyclotrons and very large magnets to steer beams of high energy charged particles. System size and cost severely limit the availability of these applications. Currently, the gantries used for proton therapy treatment rooms may extend multiple stories in height and weigh over one hundred tons. One impediment to further deployment of these and other charged particle beam systems is the size and cost of the beam acceleration and focusing equipment.

In the long term, for charged particle therapy and certain other high magnetic field applications, it is likely that superconducting magnets will be preferred over resistive magnets. Generally, superconducting magnets offer very stable and high field strengths and can be substantially smaller in size than resistive magnets. Moreover, the power demands of superconducting magnets are very low. However, the opportunity to provide superconducting magnets in new applications may be compromised because of the well-known quenching phenomenon. When the superconducting material undergoes an unexpected and rapid transition to a normal, non-superconducting state this can result in rapid formation of a high temperature hot spot which can destroy a magnet. Designs which improve reliability have been costly. Cost is a major constraint to greater commercialization of conventional superconducting magnet technologies which rely on saddle or racetrack coils. Moreover, for a given set of operating conditions, significant design efforts must be employed to achieve requirements of field uniformity and to assure that quenching does not occur during normal system use.

Whether future systems employ resistive or superconductive windings, a need will remain to improve design efficiency, reliability and field quality. In order to deploy carbon-based systems for charged particle cancer treatment, the use of superconducting magnets may be imperative in order to meet the bending requirements of the high energy carbon beam. Coil segments used to bend beams are very complex and must be very stable in order to implement a curved trajectory. Further, it is very difficult to apply conventional geometries, e.g., saddle coil and race track configurations, to curvilinear applications and still meet requirements for field configurations.

At the same time, it is necessary to provide these systems at lower costs in order to encourage wider uses that benefit society. By way of illustration, mechanical structures required to assure stabilization of conductor windings in the presence of large fields are effective, but they are also a significant factor in overall weight and system cost. There is a continuing need to build magnet systems which are more efficient, more robust and more reliable. As one example, with rotating machinery being subject to wear under conditions of continued use, there are needs to provide costly maintenance and repair. Design improvements which substantially reduce these life cycle costs and the overall affordability of high field systems can accelerate deployment of useful systems that require generation of large magnetic fields.

SUMMARY OF THE INVENTION

In a series of embodiments according to the invention, a method is provided for manufacture of a conductor assembly having multiple coil rows about an axis with outer coil rows formed about inner coil rows. The assembly is of the type which, when conducting current, generates a magnetic field or in which, in the presence of a changing magnetic field, a voltage is induced. In an example embodiment one or more first coil rows are formed. A determination is made of deviations from specifications associated with the formed one or more first coil rows, with one or more deviations each corresponding to a magnitude of a multipole field component which departs from a field specification. Based on the one or more deviations, one or more wiring patterns are generated for one or more second coil rows to be formed about the one or more first coil rows. Accordingly, the magnitude of each multipole field component that departs from the field specification is offset. The one or more second coil rows are formed in the assembly.

In another example of a method of manufacture according to the invention, measurement is made of a deviation of a multipole order from a multipole field specification in one or multiple fully formed coil rows. Offsetting corrections are introduced during fabrication of an overlying coil row to reduce deviation from the multipole field specification in the completed assembly.

In still another example, a fabrication method suppresses generation of unwanted multipole field orders in a conductor assembly comprising multiple coil rows about an axis. Outer coil rows are formed about inner coil rows, and inner and outer ones of the coil rows comprise conductor formed about the axis in a helical pattern. After forming one or more first inner coil rows, one or more outer coil rows are formed. The process of forming the one or more outer coil rows includes introducing a modulation into the one or more outer coil rows to reduce the magnitude of one or more multipole field components relative to a main field component.

Many applications of magnets for charged particle beam optics can benefit from magnets that are curved. According to embodiments of the invention, this geometry can be implemented with pure multipole fields, i.e., predominantly one multipole order, by constructing double helix coil designs along curvilinear axes. A uniform magnetic dipole field can be applied to bend a charged particle beam trajectory into an arc. A magnet coil can be designed about a curved axis in order to avoid interference between the particle beam and the inner aperture of the magnet coil, e.g., a stainless steel vacuum tube.

Simply transforming a double helix coil from a straight configuration, which generates a dipole field along a straight axis, into an arc of variable and arbitrary curvature generally leads to the introduction of higher-order multipole field components. Intuitively, this can be understood in the following way. When the straight pattern in FIG. 2 is bent around the Z-axis, conductors on the inner arc of the bend are forced closer together and the conductors on the outer arc of the bend are spread further apart. The resulting difference in wire spacing is due to the fact that the circumference on the inner arc is smaller than on the outer arc while the number of turns is the same. The consequent variation in wire spacing leads to an increased field near the wire portions positioned more closely together and a lesser field where the spacing is greater, this leading to a gradient in the field, which will be mainly a quadrupole component.

BRIEF DESCRIPTION OF THE FIGURES

FIGS. 1A and 1B are, respectively, perspective and elevation views of three-dimensional space curves illustrating a simple prior art spiral pattern;

FIG. 2 is a perspective view of a prior art coil having a regular helical geometry as used to form prior art double helix coil pairs suitable for generating a dipole field;

FIG. 3 is a perspective view of a prior art coil pattern used to form prior art double helix coil pairs suitable for generating a quadrupole field;

FIG. 4 is a perspective view of a prior art coil pair wherein the two coil patterns have opposite tilt angles relative to a plane;

FIG. 5 is an unrolled view of the quadrupole coil pattern shown in FIG. 3;

FIG. 6 is an unrolled view of a wiring pattern comprising multiple multipole components according to the prior art;

FIGS. 15A-15C illustrate in elevation views features of a fabrication process according to the invention, while

Figure 7:
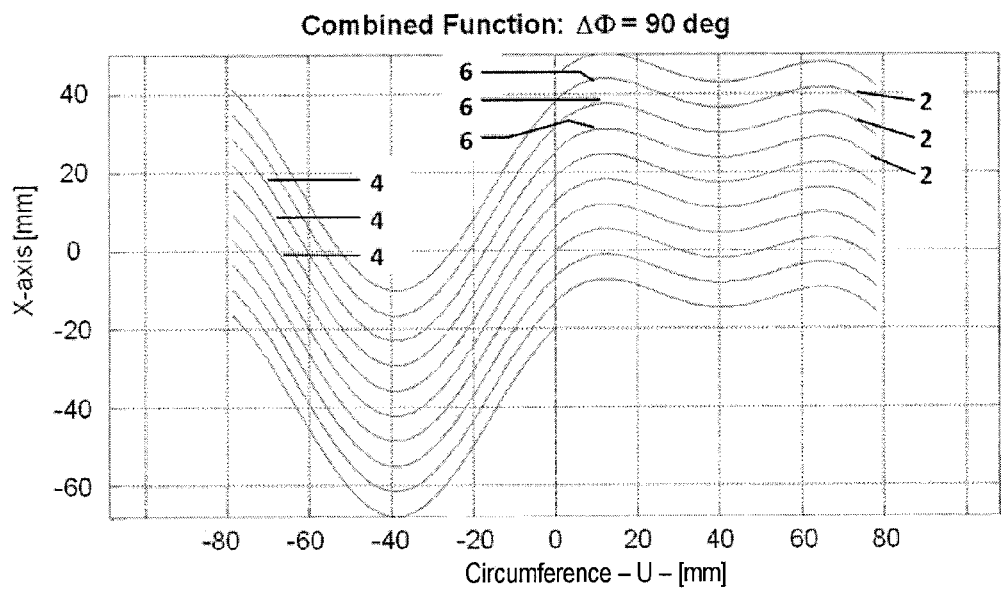
FIG. 7 is an unrolled view of a wiring pattern comprising multiple multipole components according to an embodiment of the invention.

Like reference numbers are used throughout the figures to denote like components. Numerous components are illustrated schematically, it being understood that various details, connections and components of an apparent nature are not shown in order to emphasize features of the invention. Various features shown in the figures are not shown to scale in order to emphasize features of the invention.

DETAILED DESCRIPTION OF THE INVENTION

Before describing in detail the particular methods and apparatuses related to embodiments of the invention, it is noted that the present invention resides primarily in a novel and non-obvious combination of components and process steps. So as not to obscure the disclosure with details that will be readily apparent to those skilled in the art, certain conventional components and steps have been omitted or presented with lesser detail, while the drawings and the specification describe in greater detail other elements and steps pertinent to understanding the invention. Further, the following embodiments do not define limits as to structure or method according to the invention, but provide examples which include features that are permissive rather than mandatory and illustrative rather than exhaustive.

As used herein, the terms coil, spiral, helix and helical include but are not limited to regular geometric patterns. In addition, the terms coil, spiral and helix include configurations wherein a width (e.g., along the axial direction) or a thickness (e.g., along a radial direction or transverse to the axial direction) may vary. Contemplated embodiments include variations which depart substantially from regular geometries and which therefore may not be simply described in closed form. Numerical solutions, proximate as they may be, can be applied to model and design wiring configurations which may then be constructed accordingly to a desired level of precision. Further, terms such as winding, helical winding, wiring pattern and coil configuration as applied to physical embodiments formed of various conductor and/or insulative materials, are used without regard to how the materials are formed in place. That is, although it is conventional to physically wind a strand of conductor in the configuration of a spiral, the foregoing terms as used herein refer to the resulting configuration and not the methodology used to form the pattern. So, for example, a coil or winding may be formed from a cylindrical body by removal of body material, this resulting in a shape that corresponds to a spiral winding. In addition, the void resulting from the removal of material may also correspond to a spiral shape.

With coils helically-wound about an axis to produce magnetic field components transverse to the axis, cancellation of axial field components can be effected by the formation coils in concentrically positioned pairs having opposite tilt angles, this sometimes resulting in a high quality transverse field, e.g., a uniform dipole with essentially no higher order components. See, for example, Goodzeit et al., "The Double-Helix Dipole—A Novel Approach to Accelerator Magnet Design", *IEEE Transactions on Applied Superconductivity*, Vol. 13, No. 2, June 2003, pp. 1365-1368, which describes analytics for a double helix magnet geometry. See, also, U.S. Pat. No. 6,921,042 incorporated herein by reference.

For helically wound conductors and other magnet geometries, some of these being racetrack and saddle configurations, placement of conductor has been problematic for multiple reasons. In conventional racetrack and saddle configurations, based on circular shaped-cable, the position of each wire turn has depended on the position of a previous wire turn. Such windings typically build on one another with a second row of turns being tightly wound over a previously wound row of turns. The windings are often generated with assistance of tooling that assures consistency as turns in each row are wound tightly against one another and as turns in consecutive rows are created one over the other. This tight stacking of turns has provided a means to stabilize the conductor. Further, this type of configuration often results in contact between turns in the same row as well as between turns in adjoining rows, and has required insulative coating on the conductor surface so that portions of the conductor coming into contact with other portions of the conductor are insulated from one another. To assure stability of the winding under high field conditions the turns are commonly bonded to one another with, for example, an adhesive.

In these prior systems the position and stability of the conductor has depended on the positioning of each conductor turn against another conductor turn and the ability to maintain the conductor in a static position during manufacture, assembly, and operation, i.e, under typical thermal cycling and high Lorentz forces acting during coil excitation. While the required tight nesting of turns of insulated wire without intervening layers can stabilize the conductor, the design of the wiring pattern has been limited and, thus, variation in design of the field pattern has also been limited. As shown in the illustrated embodiments, it is now possible to more fully utilize other wiring patterns, without compromising reliability, by separating all of the rows of conductor segments with intervening insulative layers and pre-defining the wiring patterns with channels formed in the insulative layers. Such techniques are more fully described in co-pending U.S. application Ser. No. 12/061,813 "Wiring Assembly and Method of Forming A Channel In A Wiring Assembly For Receiving Conductor" filed Apr. 3, 2008 assigned to the assignee of the present invention and now incorporated herein by reference.

Formation of channels into which the conductor is inserted provides precise conductor positioning and stabilization while also isolating portions of the conductor from other portions of the conductor. The channel profile is not limited to accommodating round wire or cables. Other conductors having square or rectangular shapes in cross section, or tape, can be used in conjunction with channels. The channel may be configured to match the cross sectional shape of the conductor. The conductor pattern and the corresponding channel path can be formed in a relatively tight helical configuration wherein h, the advance per turn in an axial direction, is so small that portions of the conductor in adjacent turns come very close or into contact with one another. In embodiments where contact between adjacent portions of conductor turns is a concern, the conductor has an insulative coating.

When the channels accommodate square or rectangular cross sectional shapes of conductor, including tape, to minimize deformation in conductor, e.g., twisting, a helical channel can be formed at a variable angle with respect to a central axis or reference surface. In such embodiments, the resulting field will differ from that which is generated for a conventional conductor of circular cross sectional shape. A channel for a circular shaped conductor will not follow the same path as a channel formed at such variable angle to accommodate a rectangular shaped conductor without shape deformation.

The term "conductor" as used herein refers to a string-like piece or filament of relatively rigid or flexible material, commonly referred to as cable or wire, being of the type comprising either a single conductive strand or multiple ones of such strands grouped together as one functional conductive path. The term multi-strand conductor refers to such a conductor formed as a single identifiable unit and composed of multiple conductive strands which may be twisted, woven, braided or intertwined with one another to form an identifiable single unit of wire. Multi-strand conductor may take the form of conductor that embodies a circular or a non-circular cross section.

The term cross section refers to a section of a feature, e.g., of a conductor or an aperture or a coil, taken along a plane which is transverse to a definable axis through which the feature extends. If the coil row axis is curvilinear about a point of interest on the axis, the plane along which the cross section is taken is understood to be transverse to the direction of a vector which is tangent to the direction of the axis at the point of interest.

A simple prior art spiral pattern in three-dimensional space, shown in the perspective view of FIG. 1A and the elevation view of FIG. 1B, is generated in accord with the relationships 1A, 1B and 1C:

$$X(\theta) = [h/(2*\pi)]\theta \qquad \qquad 1A$$

$$Y(\theta) = R\cos(\theta) \qquad \qquad 1B$$

$$Z(\theta) = R\sin(\theta) \qquad \qquad 1C$$

wherein the X coordinate is along a longitudinal direction parallel with an axis of symmetry and the Y and Z coordinates are along directions transverse to the axis of symmetry and orthogonal to one another. θ is the azimuthal angle measured in a Y-Z plane transverse to the X-axis. The parameter h defines the advance per turn in the X direction. R is the radius of the aperture of the winding pattern. That is, for embodiments having a regular shape, R corresponds to a radial distance from an axis of symmetry to a point on the curve, and the aperture is the volume within the shape formed by the helical pattern.

FIGS. 2 and 3 are exemplary three-dimensional space curves illustrating features of prior art coils found in double helix coil pairs. For purposes of clarity, FIGS. 2 and 3 each illustrate a single coil row. These rows correspond to regular helical geometries generated in accord with the relationships 2A, 2B and 2C:

$$X(\theta)=[h/(2*\pi)]\theta+A_n \sin(n\theta) \quad \text{2A}$$

$$Y(\theta)=R\cos(\theta) \quad \text{2B}$$

$$Z(\theta)=R\sin(\theta). \quad \text{2C}$$

The curve for n=1 is shown in the perspective view of FIG. 2. The curve for n=2 is shown in the perspective view of FIG. 3.

The term $A_n \sin(n\theta)$, in the $X(\theta)$ equation, imparts a positive or a negative tilt to each of the turns relative to the Y-Z plane, in proportion to the magnitude and sign of the term $A_n$. According to the value of n, the term $A_n \sin(n\theta)$ also introduces a modulation, i.e., a sinusoidal variation, in each 360 degree turn of the curve about the axis. For n=1, an ellipsoidal shape is imparted to each turn as shown in FIG. 2. The more complex pattern shown in FIG. 3, having a higher order sinusoidal component (n=2), is suitable for generating a quadrupole field. For higher values of n, still higher frequency sinusoidal components modulate the shape of each turn.

As can be seen from FIG. 2, with addition of the $A_n \sin(n\theta)$ term and with n=1, the turns are tilted relative to the YZ-plane. This results in a significant component of current flow in the axial direction. A transverse magnetic field is therefore generated together with an axial field component. With incorporation of a second layer of turns (as shown in FIG. 4, again with n=1), and with the two patterns having opposite tilt angles relative to the YZ-plane (by providing the terms $A_n$ in each of the two coils with opposite signs), it is possible to generate a substantially pure transverse field and practically eliminate the axial field component. This and other pairs of coil patterns having opposite tilts, i.e., for differing values of n, are referred to in the literature as double-helix windings.

Still, more generally, for several embodiments of the invention, a three-dimensional space curve may be generated in accord with the equations 3A, 3B and 3C:

$$X(\theta)=[h/(2*\pi)]\theta+\Sigma A_n \sin(n\theta+\phi_n) \quad \text{3A}$$

$$Y(\theta)=R\cos(\theta) \quad \text{3B}$$

$$Z(\theta)=R\sin(\theta) \quad \text{3C}$$

wherein $A_n$ determines the amplitudes in equation 3A, and $\phi_n$ determines phase shifts between the sinusoidal components. R determines the radius of the winding pattern, which is measured from the axis of the cylindrically shaped coil and $\theta$ is the azimuth angle. In this context the term coil and the adjective helix refer to a variety of spiral-like shapes which can result from the aforedescribed function, understanding that other trigonometric or numerical expressions may be used to define the channel path and the conductor path. The individual or combined content of the fields corresponding to one or more values of n are generally referred to as multipole moments. Field components generated from a double-helix winding configuration, and corresponding to different values of n according to equation 3 are substantially or entirely orthogonal with one another.

An individual layer of a double-helix coil simultaneously generates transverse and axial magnetic fields. Transverse in this context denotes magnetic fields having Y and Z components. In most applications the current directions in individual layers of double-helix coils are chosen in such a way that the transverse magnetic fields of layers add up, while the axial fields are canceled to a high degree. It is therefore customary to describe the magnetic field by two dimensional multipoles in the transverse plane. If the field changes along the X-direction, e.g. as is the case near the coil ends, a two dimensional multipole expansion can still be used to describe the field, and the multipole contents for different axial positions are determined In accord with equation 3A, the multipole field components that can be generated with the resulting coil pattern correspond to the values of n for which each $A_n$ is nonzero in equation 3A.

In a long winding configuration, where coil end effects can be neglected, the pattern for n=1 will generate an essentially pure dipole field having no higher order components. Similarly, a quadrupole pattern (n=2), a sextupole pattern (n=3) and other higher order patterns generate pure fields with a multipole order defined by the value of n.

Theoretically, magnetic fields of almost arbitrary shape and quality can be generated in accord with the above mathematics. However, construction of coils for generating fields with higher multipole order (n>1) or fields containing more than one multipole order, e.g., superimposed dipole plus quadrupole fields, is limited by geometrical constraints, such as requiring a minimum spacing between conductors to avoid conductor impingement. The conductor spacing in a coil is controlled by the term, h, in equation 3A. For increasing values of h the conductors are spaced further apart along the X-direction. The minimum conductor spacing corresponds to when adjacent conductors just touch each other. Any further decrease in conductor spacing would lead to interference between neighboring conductors.

FIG. 5 presents a 360 degree view of the quadrupole coil pattern shown in FIG. 3. This and other 360 views of coil patterns shown in FIGS. 6 and 7 are transforms from views of three dimensional contours such as the cylindrical-like configuration of FIG. 3, to views in a plane, referred to herein as "unrolled" views. That is, these views are generated as though the three dimensional shaped surface is cut open and layed along a plane to provide a two dimensional or plan view in which the abscissa represents the arc length over the cylinder surface and the ordinate represents the axial direction.

The minimum required conductor spacing can be illustrated in an unrolled view of the winding pattern, where the X-coordinate is plotted against the circumference U, which is given by the radius R times the azimuth angle, $\theta$). As shown in FIG. 5, the local slope of the conductor direction is $dX/dU=\tan(\alpha)$ where $\alpha$ is the slope angle in the unrolled view, which depends on the azimuth angle $\theta$. The minimum possible wire spacing without impingement is given as follows by equations 4A and 4B:

$$\tan(\alpha)=dX/dU=(1/R)(dX/d\theta) \quad \text{4A}$$

$$\text{minimum spacing}=d/\cos(\alpha_{max}), \quad \text{4B}$$

where $\alpha_{max}$ is the maximum slope angle incurred along the trajectory. As can be seen from equation 4B, the minimum spacing is determined by the largest slope angle $\alpha$ in the coil winding. See FIG. 5 for an illustration of the slope angle $\alpha$. Also, as illustrated in FIGS. 5, 6 and 7, the illustrated wiring patterns are a continuous series of segments 2. Along first portions 4 of the segments, individual segments are relatively straight and along second portions 6 of the segments the segments follow a contour having a definable radius of curvature.

Larger slope angles require larger conductor spacings in a winding pattern and thereby lower the achievable magnetic field strength of the resulting coil configuration. This is because fewer conductor turns can be applied per unit distance along the X axis. Many applications require relatively high field strengths and it may be desirable to achieve the minimum possible conductor spacing (e.g., with the conductor surfaces having an insulative coating enabling surfaces to touch one another) as defined in equation 4B. Since the higher-order multipole winding configurations have more sinusoidal oscillations per conductor turn (see equation 3A), the slope angles α generally increase with increasing multipole order content.

The minimum possible conductor spacing in combined function magnets is also affected by the phase angles $\phi_n$. See equation 3A. Qualitatively this can be understood for superimposed dipole and quadrupole fields according to $$X(\theta)=[h/(2*\pi)]\theta+A_1\sin(\theta)+A_2\sin(2\theta+\Delta\phi) \quad\quad 5A$$

For $\Delta\phi=0$, minima and maxima of the dipole component coincide with minima and maxima of the quadrupole component, while for a $\Delta\phi\neq0$ the peak values of the component sinusoidal functions are displaced. For example, referring to Equation 3A, with $\phi_i$ not equal to $\phi_j$ the peak values of the component sinusoidal functions are displaced relative to each other. The effect of this can best be seen in the unrolled view in FIGS. 6 and 7 wherein the quadrupole amplitude $A_2$ is selected to be half the dipole amplitude $A_1$. The phase shift $\Delta\phi$ is zero in FIG. 6 and is 90 degrees in FIG. 7. That is, in FIG. 7, $\phi_j-\phi_i=90$ degrees. The conductor spacing, h, for each case is set to the required minimum value.

A feature of the invention is that the maximum value of the slope angle α, referred to as $\alpha_{max}$, is a function of the relative phase shift between components of different orders, n, and this can lead to a decrease of the maximum slope angle $\alpha_{max}$ thereby reducing the minimum achievable conductor spacing h and increasing overall conductor density along the axis. This enhances the magnetic field density. For the given example with $A_2$ equal to one half $A_1$, the minimum achievable conductor spacing can be reduced by about ten percent. Increasing the conductor density increases the magnetic transfer function, thereby increasing the field magnitude per unit of current. More generally, useful improvements in the transfer function can be realized in combined function assemblies where, for individual coil rows, $X(\theta)$ includes at least the following terms:

$$[h/(2*\pi)]\theta+A_i\sin(\theta)+A_j\sin(j\theta+\Delta\phi)+\ldots$$

In example embodiments, $A_i$ is at least ten percent of $A_j$.

In a series of embodiments according to the invention, with windings configured in accord with Equations 3A, 3B and 3C to produce relatively uniform dipole fields, such winding patterns can be adapted for applications in which a charged particle beam path includes a curved portion in order to conform with a desired trajectory. Conventionally, one might couple together several sections of saddle coil windings with the sections coupled end to end at modest angles to create a curved path. Similar arrangements can be effected with multiple double helix winding segments, each formed along a straight axis.

The straight double helix segments can be configured to generate a uniform dipole field, with substantially no higher order field components, in order to displace the beam of charged particles along a direction transverse to the straight axis. With adjoining segments coupled at small angles to create such a bend, each angle corresponds to an arc length or a linear distance across the aperture through which the beam is displaced. In effect, the beam is made to follow a curved trajectory while traveling through a series of straight apertures. With this design approach the minimum radius of curvature about a bend is dependent on the beam aperture size. However, by using a Double Helix winding for this application it is possible to provide a highly uniform dipole moment (n=1) and to also incorporate a quadrupole moment to help focus the beam.

Instead of coupling segments of magnets having straight apertures, i.e., segments only having straight apertures, magnets with curved apertures may also be manufactured with helical coils. Although straight magnets based on helical coil designs according to Equations 3A, 3B and 3C can have essentially pure fields, e.g., very uniform transverse fields of a desired order, the formation of a helical coil design about a curved axis will normally generate, in addition to a primary field of desired order, one or more higher order components which cause a departure from the ideal field properties in a curved beam trajectory. According to several embodiments, by introducing further modulating components into helical conductor geometries, e.g., into individual coil loops, the undesirable components, which would otherwise degrade the field quality of a magnet, can be nearly or completely canceled. That is, multipole field components can be introduced to counter each of the undesirable higher order components, these each being of practically equal magnitude and opposite direction to an undesirable component. With numerical computation and optimization techniques, one or more multipole components of desired proportion can be introduced with precision. These arrangements can be implemented by using a combined function feature of double-helix coils. Implementations of these concepts provide for sequential variations in field properties along an axis of variable countour. For the example of an axis having a constant radius of curvature, proportions of the main field components may vary as a function of position along the axis so that along a first of three adjoining segments, a dipole field may predominate while along an adjacent second segment a quadrupole field may be the primary component, and along a third segment adjoining the second segment another dipole field may be the main field component. Generally, the relative proportions of field components may be varied to provide desired effects such as combinations of beam focusing and bending. Also, generally, use of the term "main field component" in the singular or plural refers to a multipole field component which is a dominant field component along one or more planes transverse to a central axis along which a coil row or entire magnetic assembly is formed.

Figure 8:
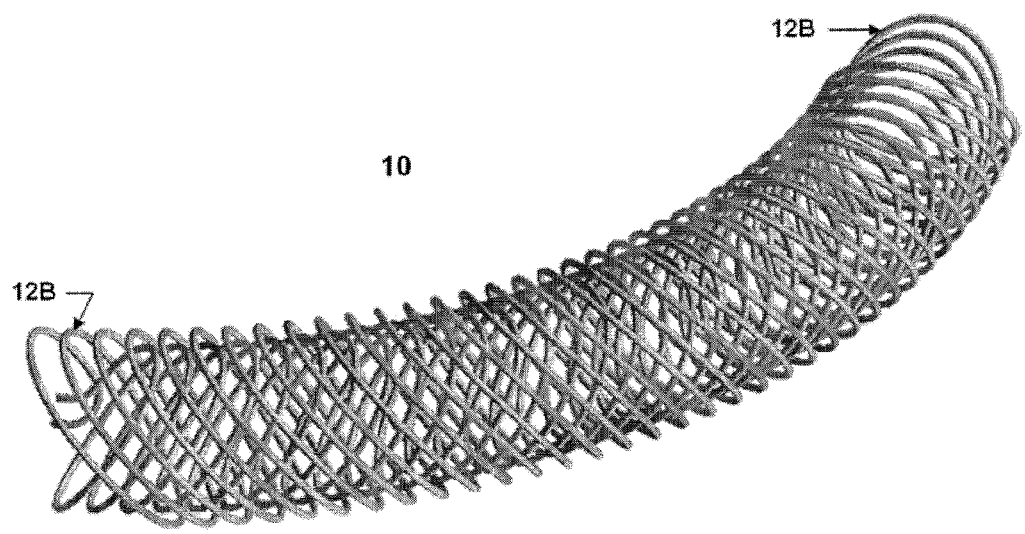
FIG. 8 is a perspective view of a magnet having a curved aperture constructed according to an embodiment of the invention.

In the example shown in FIG. 8, a double helix dipole magnet 10 has a radius of curvature of 225 mm along a central axis and an aperture radius of 25 mm. Consistent with double helix design principles, two coil rows 12A and 12B of the magnet 10 are illustrated as having opposite tilt angles with respect to transverse planes along the central axis. The magnet 10 comprises multiple pairs of similar coil rows 10 (not shown) formed over one another in a manner analogous to what has been described in Ser. No. 12/061,813 for an assembly formed along a straight axis. The geometry of the magnet 10 can be used to impart a 90° aperture bend but other radii of curvature, aperture lengths and aperture radii are readily achievable in accord with the now-described methodology. First, it is noted that designing such a magnet to such geometric specifications and desired field properties could involve calculation of conductor paths about a curved axis based directly on field specifications along a curved axis of symmetry. For example, based on the equations 3A, 3B and 3C, $$X(\theta)=[h/(2\cdot\pi)]\theta+\Sigma A_n\sin(n\theta+\phi_n) \quad\quad 3A$$

$$Y(\theta)=R\cos(\theta) \quad\quad 3B$$

$$Z(\theta)=R\sin(\theta) \quad\quad 3C$$

it is possible to perform appropriate transformations into a curvilinear system with which the transformed analytics are used to generate a set of points which describe a helical path about a curved axis of symmetry. With the path divisible into a series of conductor segments about a curved aperture, numerical techniques can be used to calculate the magnetic field about the aperture. That is, with the conductor path divisible into the segments, the field may be calculated at all points of interest by adding the contribution of each segment to each point of interest. Such an approach allows for the determination of undesirable higher order field components.

With the foregoing transformation of the analytics or, as described, when coil patterns according to a straight axis double helix configuration are mapped into curvilinear coil patterns, to create a curved magnet geometry, higher order multipole field components are introduced. In principle, these effects can be compensated using mathematics in a curvilinear system by introducing appropriate changes in the modulation of the curvilinear coil patterns. Undesired multipole field components could be directly removed by adding offsetting mulitpole components directly into the analytical equations which describe the curvilinear coil patterns. In practice, the volume and complexity of numerical calculations required to perform these corrections, whether in rectangular or a curvilinear coordinate system, can make it a lengthy iterative process to directly determine the necessary compensating components that offset undesired higher order multipole field components.

Instead of adding correction factors to the analytics describing a curvilinear coil pattern, the undesired multipole components, e.g., components introduced by bending from the straight geometry, useful adjustments for the curvilinear coil patterns can be created in the untransformed coil configuration as defined along a straight axis. Another feature of the invention is based on recognition that substantial orthogonality is preserved among multipole components in both the straight and curvilinear systems. Numerous embodiments of coil designs may be developed based on point-to-point transformations between patterns formed on straight and curved axes. For example, adjustments needed to cancel specific multipole field components in the design for a curvilinear coil pattern can be based on corrections made to the model of a corresponding straight axis coil configuration from which the curvilinear coil pattern is derived.

Thus, for the first time, the design for a straight geometry coil configuration can be applied to design coil patterns having a curved geometry with the reduction or elimination of all undesired multipole field components. Within a desired degree of tolerance, a helical coil magnet with a curvilinear aperture can be constructed along a curved aperture with substantially the same multipole field quality as a magnet constructed along a straight axis. Additional multipole components suitable for the application may also be introduced to the analytics for the straight geometry so that, after transformation into the design for the curved geometry, the magnet exhibits substantially the same multipole field quality as a magnet constructed along a straight axis.

For illustrated embodiments a method of achieving the desired field quality along a curved axis may include a repetitive process of performing transformations between the straight and curvilinear analytics, with modifications to the straight geometry analytics until desired field properties are attained for a magnet constructed along the curved aperture. As used herein, field quality refers to measures of the relative magnitudes or uniformities among multipole field components in a magnet. Examples follow. A detailed process is now described for design and construction of magnets, including the magnet 10 of FIG. 8, with optimized multipole content.

The above-described parametric representation, in terms of $X(\theta)$, $Y(\theta)$, $Z(\theta)$ describes the space curve for a single layer, i.e., one helical shaped coil row comprising a continuous series of open conductor loops. In the following descriptions, although reference is made to space curves for individual layers, it is to be understood that actual designs and the construction of magnets accordingly involve implementing the described processes to create multiple coil rows formed about one another. The fields from each row are additive such that a model of the conductor path can be constructed for each coil row and the generated field can be determined by adding contributions generated by each. Reference to generated fields in the several examples may be understood to mean the aggregate fields generated by multiple coil rows or the field components generated by a single coil row. For purposes of more clearly presenting features or advantages of the invention, the field calculations presented in Tables 1, 2 and 3 are representative of calculated field strengths made along points on the axes which are at least three aperture diameters from the coil ends. This substantially avoids inclusion of contributions stemming from uncompensated higher order terms characteristically found around the coil ends of many magnets.

The magnetic field in a long straight section of a cylindrical-shaped helical configuration, generating a transverse field, can be considered as two dimensional and can be described in a cylindrical coordinate system in accord with the following harmonic expansion:

$$B_\theta(r, \theta) = B_{ref} \cdot \sum_{n=1}^{\infty} \left(\frac{R}{R_0}\right)^{n-1} \cdot (b_n \cdot \cos(n\theta) + a_n \cdot \sin(n \cdot \theta))$$

$$B_r(r, \theta) = B_{ref} \cdot \sum_{n=1}^{\infty} \left(\frac{R}{R_0}\right)^{n-1} \cdot (b_n \cdot \sin(n\theta) - a_n \cdot \cos(n \cdot \theta))$$

wherein $R_o$ is the reference radius measured from the axis and $B_{ref}$ is the magnitude of the main field at this radius. The coefficients $b_n$ and $a_n$ are dimensionless normal and skew multipole components that determine the angular orientation of the different components relative to each other.

Although the harmonic expansion describes a two-dimensional field along an infinitely long axis, it is also convenient to characterize the end fields of a magnet of limited length with the same harmonic expansion. In this case, along axial positions that are less than three aperture diameters from the coil ends, the two dimensional multipole field components in planes transverse to the axis will vary as a function of the axial position, while at further distances from the coil ends the field components are relatively constant. This assumes that the coil extends along the axis at least a distance of six aperture diameters. Also, within three aperture diameters of the coil ends, there is a non-zero axial field component $B_x$, which can be determined independently.

When numerically computing multipole fields in the magnet it may be assumed that the conductor path can be represented by an infinitely thin filament located at the center of the physical conductor, which in many instances may have a circular cross section. Square or rectangular-shaped conductors can also be modeled by placing the thin filaments in the conductor cross section in such a way that they approximate the current distribution within the conductor. A three-dimensional space curve of a conductor may be described as a polygon of small straight filament sections. The end points of each polygon segment will coincide with the actual space curve, and for a sufficiently large number of elements, the polygon describes the space curve with a high degree of precision.

For an infinitely thin and short filament of conductor segment, the magnetic field at any point in space not coinciding with the conductor segment is given by the Biot-Savart Law as follows:

$$\vec{dB} = \frac{I \cdot \vec{dl} \times \vec{P}}{P^2}$$

where dB is the field vector, I is the transport current flowing through the conductor, dl is the tangent vector of the filament segment and P is the vector from the segment to a point at which the field is to be determined. By summing the field contributions from all segments along the space curve describing the conductor path, an approximation of the magnetic field is obtained. The accuracy of the approximation increases as the conductor is divided into a greater number of segments for which individual computations dB are performed.

The multipole content can then be determined in the following way. For a coil row formed along a straight axis, in a plane transverse to the axis, the field components $B_r$ and $B_\theta$ are calculated for n points P equally spaced along the azimuth of a reference circle formed in the plane and centered about the axis. A Fourier analysis of these field values with appropriate normalization yields the multipole fields in units of Tesla or Gauss. The axial field component may be neglected for the purposes of assessing or modifying the transverse field components in a double helix coil configuration. The same multipole field analysis can be performed for a series of circles (each in a different plane transverse to the axis and intersecting different positions) along a straight or curved magnet axis.

For the single layer space curve corresponding to one coil row in a pure dipole double helix magnet formed along a straight axis, $$X(\theta)=[h/(2\pi)]\theta+A_1(\sin\theta).$$

Figure 9A:
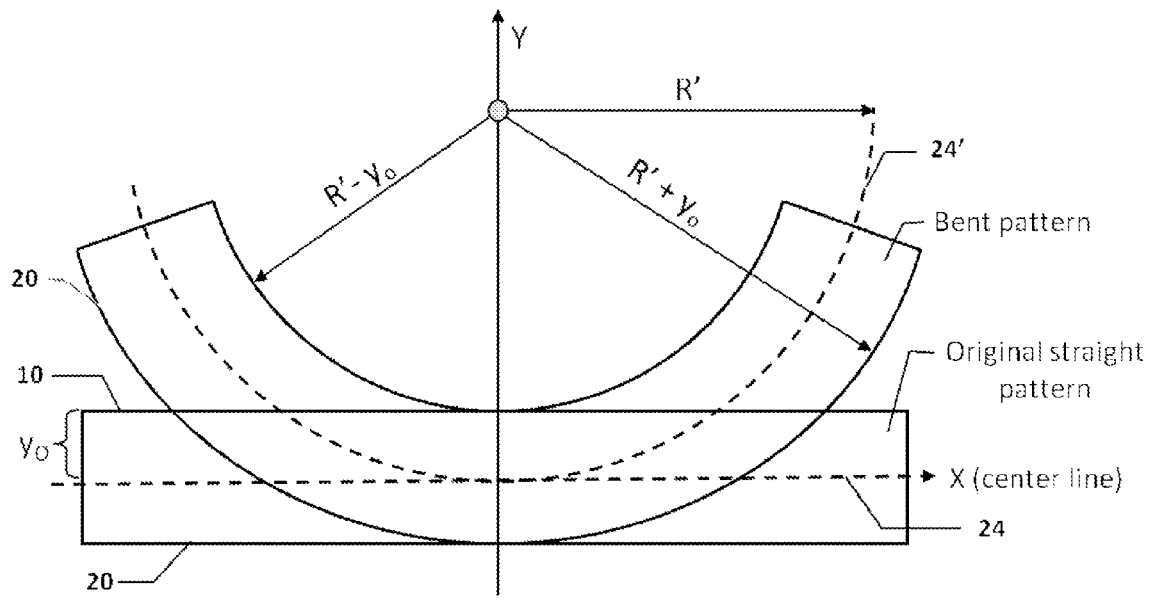
FIGS. 9A and 9B illustrate relationships corresponding to coordinate transformation between straight and curved helical coil rows.
Figure 9B:
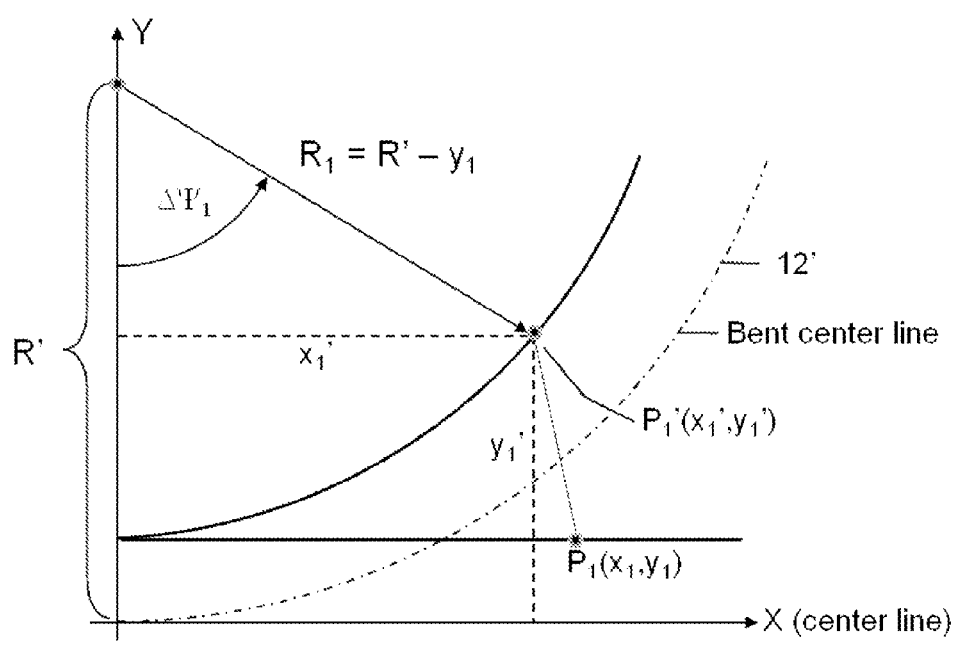

Such a single layer, formed along a straight axis, contains an axial field component. Recalling, also, that $$Y(\theta)=R\cos(\theta)$$

$$Z(\theta)=R\sin(\theta)$$

the axial field component can be canceled by adding a concentric coil row having a slightly different radius. With the first and second coil rows having opposite tilt angles and current directions, the two coil rows form a pair which provides an equal but opposite axial current flow that cancels out. Exemplary pairs of coil patterns generated according to this equation can be transformed into coil patterns along a curved axis of symmetry. See FIG. 9 in which a two-dimensional Cartesian coordinate system is shown to include an X axis and a Y axis which intersect with one another at (x,y)=(0,0). FIG. 9A illustrates the pattern of a straight helical coil row 20 in a pair of rows formed along a straight axis 24 coincident with the X axis and also illustrates the straight row transformed into a curved double helix coil row 20' formed along a curved axis 24'. As shown in FIG. 9B the coil row 20 has the shape of a regular cylinder with an inner radius $y=y_1$ corresponding to the coil aperture. In this simple example the coil row 20 is transformed into a geometry having a circular radius of curvature, wherein R' corresponds to the bending radius of curvature along a center line coincident with the Y axis. In the transformation the straight X axis 24 becomes the curved axis 24' which is an axis of symmetry for the coil row 20'. In the plane positioned on the Y axis and orthogonal to the X axis, cross sections of the row 20 and the row 20' completely coincide. The curved axis 20' is symmetric about the Y axis (x=0), having an inner radius of curvature, $R_1'=R'-y_1$, and an outer radius of curvature, $R_2'=R'+y_1$.

Next, referring also to FIG. 9B, for an arbitrary point $P_1$ $(x_1,y_1)$ which maps into a point $P_1'(x_1',y_1')$, the distance, $x_1$, of the point $P_1$ along the X axis (relative to x=0) is the arc length along the radius $R_1$ between the origin (0,0) and the point $P_1'(x_1',y_1')$.

For the transformation of a given point $(x_1, y_1)$ the bending radius depends on the y-coordinate.

$$R_1'=R'-y_1$$

$$Arc_1=x_1=R_1'*\Delta\Psi_1$$

$$\Delta\Psi_1=x_1/R_1'=x_1/(R'-y_1)$$

The resulting transformation is:

$$x_1'=R_1'\sin(\Delta\Psi_1)$$

$$y_1'=y_1+R_1'(1-\cos(\Delta\Psi_1))$$

$$z_1'=z_1$$

Through this bending transformation changes in the multipole field content appear attributable to a conductor spacing which is smaller on the inside of the arc than the conductor spacing on the outside of the arc having radius $(R'+y_1)$. Increased wiring density, i.e., distance between adjacent portions of turns, along the inside of the arc, having radius $(R'-y_1)$, creates a higher field in that vicinity, relative to decreased wiring density, along the outside of the arc, which results in a relatively lower field. Such an asymmetric wiring pattern about the coil axis is believed to result in generation of higher-order multipole components. The main effect of transforming a pattern from a straight axis to a curved axis is a field gradient which primarily creates a quadrupole component. When a pure dipole moment is desired for the transverse field along the curved axis 24', the higher-order terms resulting from the bend can be offset by introducing additional moments that cancel the components introduced by the bending transformation. This compensation can effectively be designed by introducing higher-order multipole components into the pattern for the straight coil 20 and then transforming the modified pattern of coil 20 into a revised pattern for the coil 20'. By choosing the signs and amplitudes of these components appropriately, the curved coil row 20' can generate a substantially pure dipole field. The correction to remove the undesired field gradients can be determined as an iterative process until the undesired components are reduced to a factor which is multiple orders of magnitude smaller than the dipole moment.

Figure 10:
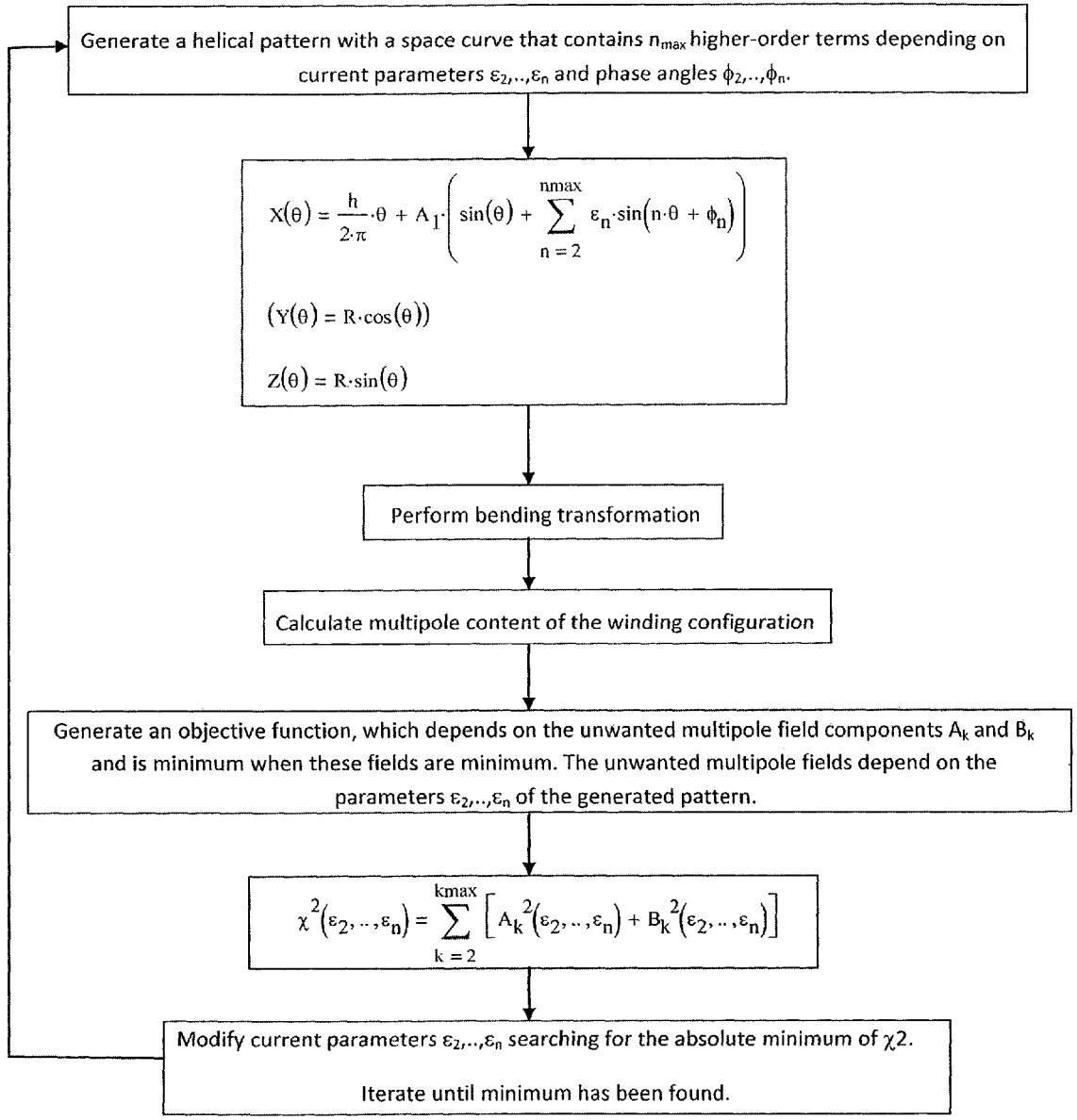
FIG. 10 illustrates an iterative process according to a methodology for determining values of geometric parameters for construction of the curved helical coil row of FIG. 9 according to multipole component specifications.

FIG. 10 illustrates an exemplary procedure which can be applied to determine the higher-order terms which are to be introduced into the straight winding in order to offset the higher-order terms resulting from the transformation which generates the coil 20'. Initially the space curve conductor patterns are generated for each coil row 20 formed along the straight axis 24. For a pure dipole field the initial values of each $\in_n$ would be zero. Depending on the multipole moments desired in the curved magnet geometry, the space curve can be made a function of one or multiple ones of the parameters $\in_n$.

Also, during the iterative process of FIG. 10, various ones of the terms $\in_n$ may be identified as parameters which are to be adjusted in order to remove unwanted multipole components.

A bending transformation is applied to the coil row space curves to generate a curved magnet geometry defining each coil row 20'. This is followed by calculation of the multipole content of each coil row 20', individually or collectively. The multipole content may be determined with the Fourier analysis described above. For each of the components found in the analysis there is an associated value $\in_n$. Based on this analysis and specified design criteria, certain multipole fields are identified as unwanted and an objective function is generated to develop modulations in the wiring pattern in order to generate field components which offset the undesired fields. That is, a term $\in_n$ exists for each unwanted field component, and an objective function is structured to find values of each $\in_n$ to offset unwanted field components. When incorporated into Equations 3, the values of each $\in_n$ generated by the objective function will contribute to generation of a field component that offsets one of the unwanted field components. An objective function may be structured to provide a net minimum value field magnitude for a given multipole order when the strength of an unwanted field falls below a predetermined value. The parameters $\in_n$ are modified for relevant values of n, based on a search which seeks to minimize each unwanted field component. Once this is done the process may be repeated based on a transformation of a new space curve (including the values of $\in_n$ generated by the objective function) from a straight coil row 20 into a coil row 20' along the curved axis 24'.

More generally, the process can be summarized as first defining the space curve for a coil row along a straight axis according to a set of parameters which meet specifications and then doing a transformation of the curve into a desired curvilinear geometry. A determination is made of deviation from the specifications. The deviation is minimized by varying parameters that affect modulation of the space curve, e.g., according to the process of FIG. 10.

Figure 11:
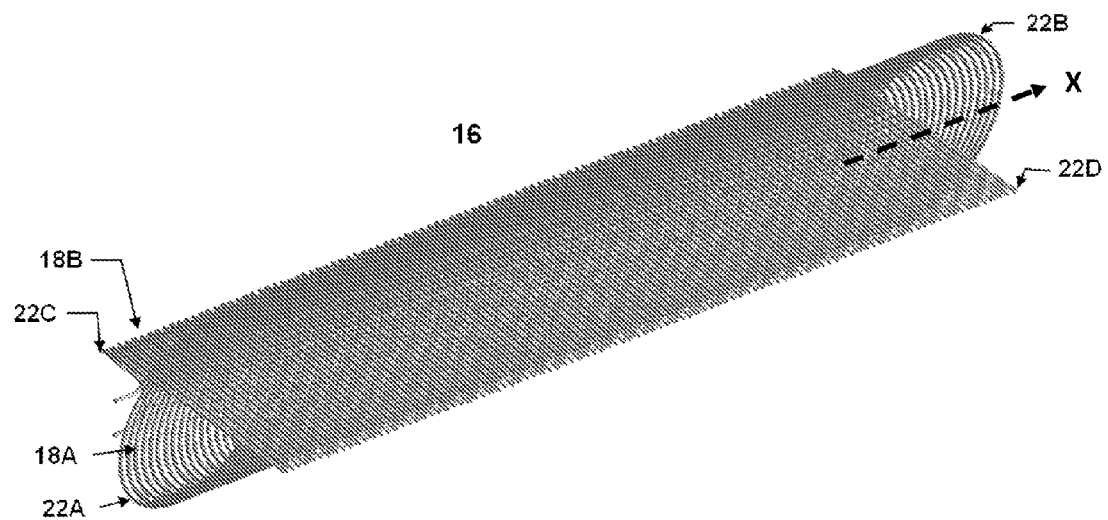
FIG. 11 is a perspective view of a magnet design used in practicing a method according to the invention.

In another example illustrated in FIG. 11, a double-helix coil magnet 16 is formed along a straight axis consisting of two coil rows 18A and 18B in accord with equations 3A, 3B and 3C and n=1, each row having an exemplary 100 turns and a coil aperture radius of 25 mm. As used herein the term coil aperture radius corresponds to the distance R in the equations 3B and 3C for the inner coil row 18A. The distance R, used in the equations 3B and 3C for the coil row 18B, has a value of 27 mm. Generally, in the described embodiments, the distance R corresponds to the distance between the axis of symmetry along the coil and the center axis of the conductor, e.g., a round wire, used to generate the coil pattern. Also, it is assumed that the usable aperture is actually somewhat smaller than the value of R for row 18A to account for wire thickness and coil support and possible other intervening materials. Magnets based on bending transformations relative to the magnet 16 may have relative spacings between coils rows, e.g., rows 12A and 12B, which are consistent with the relative spacings described for the straight coil rows 18A and 18B. That is, even though the rows 12A and 12B are formed about a curved axis, the differences in distance of each of these rows relative to the central axis is consistent with the example distances of 25 mm and 27 mm. However, other embodiments may be based in part on variations in such spacings.

Tables 1a through 1d list for the magnet 16 the corresponding calculated multipole content along perimeters of circles transverse to the axis to illustrate dependence of multipole fields as a function of radial distance from the axis. The multipole content is calculated along a plane passing through the center point of the magnet axis which is also three aperture diameters from each coil end. The circles are of varying radius relative to the 25 mm aperture radius, i.e., 5 mm, 10 mm, 15 mm and 20 mm with field calculations based on a coil current of 236 A which generates a dipole field of 1000 Gauss. Tables 1 also illustrate that the relative magnitudes of the higher-order multipole components (in particular, compared to the dipole component) increase with increasing distance from the axis. However, it can be seen that even at a 25 mm reference radius, which is 80 percent of the coil aperture radius, the higher-order multipole fields are still about one part per million of the main dipole field.

TABLE 1a

Multipole content for straight coil 16 at reference radius R = 5 mm. The dipole field of 1000 Gauss is based on a 236 A coil current.

| MP Order | An | Bn | Cn |
|---|---|---|---|
| 1 | 1.78E−02 | 1.00E+03 | 1.00E+03 |
| 2 | −1.69E−04 | 2.42E−04 | 2.95E−04 |
| 3 | −1.25E−06 | −5.03E−05 | 5.03E−05 |
| 4 | −8.56E−09 | 1.45E−07 | 1.45E−07 |
| 5 | −3.60E−11 | 1.59E−07 | 1.59E−07 |
| 6 | −3.22E−14 | 5.77E−10 | 5.77E−10 |
| 7 | 2.36E−12 | −4.68E−08 | 4.68E−08 |
| 8 | −4.31E−13 | −3.23E−10 | 3.23E−10 |
| 9 | −2.07E−12 | −2.81E−09 | 2.81E−09 |
| 10 | 9.49E−13 | −6.21E−12 | 6.29E−12 |

TABLE 1b

Multipole content for straight coil 16 at reference radius R = 10 mm. The dipole field of 1000 Gauss is based on a 236 A coil current.

| MP Order | An | Bn | Cn |
|---|---|---|---|
| 1 | 1.78E−02 | 1.00E+03 | 1.00E+03 |
| 2 | −3.35E−04 | 4.79E−04 | 5.85E−04 |
| 3 | −4.95E−06 | −1.97E−04 | 1.97E−04 |
| 4 | −6.76E−08 | 1.16E−06 | 1.16E−06 |
| 5 | −5.58E−10 | 2.54E−06 | 2.54E−06 |
| 6 | −1.18E−11 | 1.85E−08 | 1.85E−08 |
| 7 | 6.43E−11 | −3.00E−06 | 3.00E−06 |
| 8 | −1.34E−12 | −4.14E−08 | 4.14E−08 |
| 9 | −9.58E−12 | −7.20E−07 | 7.20E−07 |
| 10 | 1.79E−12 | −3.02E−09 | 3.02E−09 |

TABLE 1c

Multipole content for straight coil 16 at reference radius R = 15 mm. The dipole field of 1000 Gauss is based on a 236 A coil current.

| MP Order | An | Bn | Cn |
|---|---|---|---|
| 1 | 1.80E−02 | 1.00E+03 | 1.00E+03 |
| 2 | −4.97E−04 | 7.08E−04 | 8.65E−04 |
| 3 | −1.09E−05 | −4.25E−04 | 4.25E−04 |
| 4 | −2.23E−07 | 3.92E−06 | 3.93E−06 |
| 5 | −2.70E−09 | 1.29E−05 | 1.29E−05 |
| 6 | −9.15E−11 | 1.41E−07 | 1.41E−07 |
| 7 | 7.41E−10 | −3.41E−05 | 3.41E−05 |
| 8 | 6.14E−12 | −7.18E−07 | 7.18E−07 |
| 9 | −2.72E−10 | −1.85E−05 | 1.85E−05 |
| 10 | −2.58E−12 | −9.52E−08 | 9.52E−08 |

TABLE 1d

Multipole content for straight magnet 16 at reference radius R = 20 mm. The dipole field of 1000 Gauss is based on a 236 A coil current.

| MP Order | An | Bn | Cn |
|---|---|---|---|
| 1 | 1.82E−02 | 1.00E+03 | 1.00E+03 |
| 2 | −6.51E−04 | −2.51E−04 | 6.98E−04 |
| 3 | −2.09E−05 | −1.22E−03 | 1.22E−03 |
| 4 | −1.13E−06 | 8.37E−04 | 8.37E−04 |
| 5 | 3.78E−07 | −7.92E−04 | 7.92E−04 |
| 6 | 2.20E−07 | 4.43E−04 | 4.43E−04 |
| 7 | 1.34E−06 | 3.06E−04 | 3.06E−04 |
| 8 | 1.01E−06 | −1.10E−03 | 1.10E−03 |
| 9 | −2.52E−06 | −4.91E−04 | 4.91E−04 |
| 10 | −1.15E−06 | 1.52E−03 | 1.52E−03 |

According to an embodiment of the invention, a bending transformation is applied to the straight coil rows, converting them into a curved geometry which covers an arc section of 90 degrees. In this example, the resulting winding pattern conforms with the shape of the magnet 10 of FIG. 8. The curved coil rows 12A and 12B are each based on a transformation of one of the straight rows 18A or 18B. For the dipole coils 12A and 12B, prior to inclusion of any additional moments to cancel or offset higher order terms resulting from the bending transformation, the calculated multipole field strengths are shown in Table 2. As can be seen a strong quadrupole component $B_2$ has developed, which is about two percent of the main field $B_1$. Additionally, smaller higher-order terms have been introduced.

TABLE 2

Multipole content for the magnet 10 formed along a curved axis at a reference radius of 20 mm (80% of coil aperture). The skew dipole component $A_n$ (n = 1) has been adjusted to $1 \times 10^{-7}$ by introducing a small phase angle of $2 \times 10^{-5}$. The dipole field of 1000 Gauss is based on a 236 A coil current.

| MP Order | An | Bn | Cn |
|---|---|---|---|
| 1 | 2.61E−07 | 1.00E+03 | 1.00E+03 |
| 2 | −2.49E−03 | −2.03E+01 | 2.03E+01 |
| 3 | −2.04E−04 | −1.07E+00 | 1.07E+00 |
| 4 | −1.58E−05 | −5.18E−02 | 5.18E−02 |
| 5 | −9.45E−07 | −3.96E−03 | 3.96E−03 |
| 6 | −3.56E−07 | 3.81E−04 | 3.81E−04 |
| 7 | 4.28E−07 | 8.15E−04 | 8.15E−04 |
| 8 | 9.01E−07 | −1.05E−03 | 1.05E−03 |
| 9 | −1.44E−06 | −2.88E−04 | 2.88E−04 |
| 10 | −8.00E−07 | 5.42E−04 | 5.42E−04 |

Noting that the $X(\theta)$ equation for each of the coils 18A and 18B produces a pattern which generates a dipole field based on presence of a term $A_1(\sin \theta)$, the process for reducing all of the higher order field components introduced by the bending transformation begins with introducing to the $X(\theta)$ equation additional components:

$$X(\theta)=[h/(2\pi)]\theta+A_1(\sin \theta+\in_2 \sin(2\theta+\Delta\phi_2)+\in_3 \sin(3\theta+\Delta\phi_3)+\in_4 \sin(4\theta+\Delta\phi_4)), \quad (6)$$

wherein each additional component is of an order that is the same as an order of a component which is to be offset. As can be seen from equation 6, describing $X(\theta)$, the modulation along a straight axis can consist of a sum of multiple sinusoidal components, with each component having a weighting factor $\in_n$. Once a determination is made as to which of the components of the multipole orders, introduced by the transformation to the curved geometry, are to be reduced or eliminated, a correction component for each such multipole component can be incorporated into the equation for $X(\theta)$, i.e., by assigning an appropriate weighting. The offsetting of these undesired component magnitudes is had by giving the added correction components signs opposite those of the undesired components.

In this example the offsetting terms introduced are limited to the quadrupole component $\in_2 \sin(2\theta+\Delta\phi_2)$, the sextupole component $\in_3 \sin(3\theta+\Delta\phi_3)$ and the octupole component $\in_4 \sin(4\theta+\Delta\phi_4)$. Using the well known Simplex algorithm the six corresponding parameters $\in_n$ and $\Delta\phi_n$ (for n=2, 3 or 4) are optimized in such a way that the undesired multipole fields resulting in the bent coil 10 from the transformation become offset, i.e., the net magnitude for each higher order component is reduced. As can be seen in Table 3 the components corresponding to multipole orders 2, 3 and 4 are thereby suppressed. The optimized parametric values of $\in_n$ and $\Delta\phi_n$ are listed in Table 4. All multipole field components that have been optimized are reduced to levels more than ten orders of magnitude smaller than the magnitude of the main field component. Table 3 confirms that higher multipole orders can be reduced by 13 to 15 orders of magnitude relative to the main field component. Understanding that some applications do not require such high field quality, embodiments include suppression of multipole field components by 3 orders of magnitude or higher, e.g., 4, 6, 8, 10 or more orders. The design process may comprise multiple cycles of iterative optimizations, where in each cycle a new set of field calculations are performed on a curved pattern and an objective function is optimized by modifying the straight geometry until the magnitudes of the undesired higher order components fall below a predetermined level of acceptability.

TABLE 3

Net multipole content for the magnet 10 formed along a curved axis at a reference radius of 20 mm (80% of coil aperture) after introduction of offsetting components to suppress quadrupole, sextupole and octupole fields. The current remained at 236 A.

| MP Order | An | Bn | Cn |
|---|---|---|---|
| 1 | −1.05E−06 | 1.00E+03 | 1.00E+03 |
| 2 | 1.98E−10 | 4.61E−12 | 1.98E−10 |
| 3 | 1.65E−10 | −1.38E−10 | 2.16E−10 |
| 4 | −3.59E−11 | −1.29E−10 | 1.34E−10 |
| 5 | −1.32E−06 | −4.85E−03 | 4.85E−03 |
| 6 | −1.19E−06 | 8.94E−05 | 8.94E−05 |
| 7 | 8.66E−07 | −4.58E−05 | 4.59E−05 |
| 8 | 6.87E−07 | 3.22E−04 | 3.22E−04 |
| 9 | −1.41E−06 | 6.31E−04 | 6.31E−04 |
| 10 | −4.07E−07 | −1.89E−03 | 1.89E−03 |

TABLE 4

Optimized Parameters resulting in the filed components listed in Table 3.

| | $\in_n$ | $\Delta\phi_n$ |
|---|---|---|
| $\in_2 \sin(2\theta + \Delta\Phi_2)$ | 1.358833E−02 | 1.227936E−04 |
| $\in_3 \sin(3\theta + \Delta\Phi_3)$ | 7.656867E−04 | 1.786302E−04 |
| $\in_4 \sin(4\theta + \Delta\Phi_4)$ | 4.299757E−05 | 2.413683E−04 |

After performing the optimization to determine values for the parameters, the $X(\theta)$ equation for each of the wiring patterns in the straight double helix coil 16 becomes as follows:

$$X(\theta) = [h/(2\pi)]\theta +$$
$$A1 * (\sin(\theta) + 1.358833e - 2 \times \sin(2*\theta + 1.227936e - 4) +$$
$$7.656867e - 4 \times \sin(3*\theta + 1.786302e - 4) +$$
$$4.299757e - 5 \times \sin(4*\theta + 2.413683e - 4)).$$

Changes in the decapole field component, after optimization of quadrupole, sextupole and octupole fields (compare values in Tables 2 and 3), indicate that in performing the adjustment procedure multipole components of different orders do not behave completely independently from one another, i.e., they do not exhibit completely orthogonal behavior during the suppression process. Upon adding modulation components corresponding to lower orders, the field of the decapole order (B5) changed to −4.85E-03 from a value of −3.96E-03. However, if the optimization procedure included these orders as well, they would also be substantially reduced.

The procedure described here for the adjustment or suppression of certain multipole components has various applications. Magnet coils are often equipped with surrounding iron yokes, which can enhance the field generated by the coil or are needed to limit the fringe magnetic field. Iron saturates at high magnetic fields, and the field enhancement due to the iron yoke saturates. This leads to higher-order multipole components at high levels of magnet excitation. If the field uniformity of such a magnet is most important at high field levels, the described optimization procedure can be used to offset undesired higher-order terms. As for curved geometries, higher-order offsetting terms can be introduced into the coil geometry in accord with the equation $$X(\theta)=[h/(2\pi)]\theta+A_1(\sin\theta+\in_3\sin(3\theta+\Delta\phi_3)+\in_5\sin(5\theta+\Delta\phi_5+\ldots)), \quad (7)$$

with the parameters optimized to compensate field components caused by iron saturation at a certain coil excitation. More generally, both iron saturation effects and superimposed error fields (e.g., caused by interfering magnetic systems of materials) can be offset in a coil assembly. These types of corrections can also be implemented for other aperture geometries described herein.

The optimization approach can additionally be used to compensate for field errors that are introduced by unavoidable manufacturing tolerances. The performed optimization shows that systematic field errors, i.e., those intrinsic to the design of the conductor pattern can be controlled with very high accuracy. However, the suppression of higher order multipole fields that can be achieved in a magnet also depends on the manufacturing accuracy, i.e., with the degree of precision of conductor placement. Since conductors can only be placed with certain accuracy in coil manufacturing, unwanted higher-order field components will result. In the above example, for a coil with a 25 mm aperture, the modulation amplitude generating the main dipole field is also 25 mm. The optimized parameter $\in_2$ correcting the unwanted quadrupole component (see Table 4) is $1.36\times10^{-2}$. Multiplying this factor with the main amplitude amounts to about 0.35 mm. The smallest amplitude modulation that can be realized in machining of support grooves is mainly determined by the resolution of the angular encoders and motors of the machining centers of a CNC machine and, to a lesser extent, by absolute accuracy of the machine. It is therefore possible to implement modulations of the main amplitude down to a level of 0.001 mm.

Embodiments of the invention are based in part on recognition that individual field components of differing orders in a helical coil configuration may not be completely orthogonal to one another. Noting again that the decapole order $B_5$ shown in Table 3 became larger when the optimization was only preformed for three other orders, it is recognized that individual multipole orders cannot always be adjusted without affecting one or more other multipole components of different order. It is with simultaneous optimization of all relevant parameters, e.g., for multiple relevant multipole orders, that satisfactory reduction of all undesired field components can be assured.

Thus, for the first time, the design for a straight geometry coil configuration can be applied to design coil patterns having a curved geometry with the reduction or elimination of all undesired multipole field components. Within a desired degree of tolerance, a helical coil magnet with a curvilinear aperture can be constructed along a curved aperture with substantially the same multipole field quality as a magnet constructed along a straight axis. Additional multipole components suitable for the application may also be introduced to the analytics for the straight geometry so that, after transformation into the design for the curved geometry, the magnet exhibits substantially the same multipole field quality as a magnet constructed along a straight axis. For illustrated embodiments the method of achieving the desired quality may include an iterative process of performing transformations between the straight and curvilinear patterns with modifications to the parameters describing the straight geometry until calculations indicate that desired field properties are attained for a magnet constructed along a curved aperture. Field quality is directly based on the relative magnitudes of multipole field components.

In summary, for the example of FIG. 8, design of the double helix coil 10 having a 90° bend begins with a first transformation of the analytics from the straight geometry to the geometric specification for a magnet having the curvilinear coil aperture. This is followed by field calculations which indicate the extent to which undesired higher order field components are present due to the direct transformation of the coil from a straight axis to a curved axis. In the example of FIG. 8, modeling of the field generated along the curved axis confirms that a quadrupole moment and, to a lesser extent, higher order multipole components have been introduced. Analysis of the transverse field indicates presence of a quadrupole component that is approximately two percent that of the dipole field along the perimeter of a circle having a reference radius of 20 mm, i.e., 80 percent of the 25 mm aperture radius. See again Table 2. The field calculations are representative of values at positions along the axis which are at least three aperture diameters from the coil ends.

Next, a determination is made of an adjustment to the analytics to generate an appropriate quadrupole component that offsets the quadrupole magnitude by about 20 Gauss relative to the dipole field. This is based on the relationship shown in equation 6, wherein modulation factors $\in_n$ are expressed as normalized magnitudes relative to $A_1$.

The foregoing demonstrates that the combined function capability of a helical coil design can suppress or tune out an undesired quadrupole moment when creating a curved geometry without degrading the strength or quality of the primary, e.g., dipole, field. The adjustment process can also be applied to a complete magnet with yoke to tune out saturation induced multipoles as required.

Generally, a helical coil formed about a curved axis can be designed to produce a substantially pure field, e.g., a dipole field, of a given order, or to produce combinations of superimposed multipole fields. By design, one or more field components can be made many orders of magnitude larger than other field components. Pure dipole fields can also be produced when an iron yoke surrounds the coils, especially at higher field levels. The coil winding pattern on a helical path can be modified to practically eliminate saturation induced multipoles, e.g., in a dipole magnet.

The compensation of higher order fields can be implemented in a manufacturing process. Placement of the conductor in precisely machined grooves, as described in co-pending application Ser. No. 12/061,813 assures that desired introduction of modulation components in each loop is of sufficient accuracy to effect the field cancelations. Further, the placement of conductor in machined grooves is advantageous for the manufacturing of magnets having helical shaped coils formed about curved axes because slippage, or movement, of the conductor under the effects of strong Lorentz forces and temperature cycling, is mitigated or completely avoided.

Stabilization of conductors forming a curved coil geometry is of utmost importance for normal conducting and superconducting winding configurations. In the past conventional winding technology has not been applied to curved magnet geometries, e.g., wherein part or all of the aperture is formed along a curved axis of symmetry. Nor is it suitable to wrap a winding around a curved support structure like in a solenoid or window-frame type configuration because conductors so deployed in a bent geometry can easily shift or slip over the surface of the support structure. Technology to hold the conductor in position is needed to achieve precise and stable conductor placement. In high field superconducting magnets this requirement is more stringent than for resistive magnets since larger Lorentz forces are present to act on the conductor. Frictional movement due to slippage of the conductor can initiate quenching of a superconducting coil, in which a rapid transition from the superconducting to the normal conducting phase takes place. Machining of support grooves or channels into the surface of the support structure is a reliable way of achieving precise conductor placement with high mechanical robustness. See, again, Ser. No. 12/061,813.

Figure 13A:
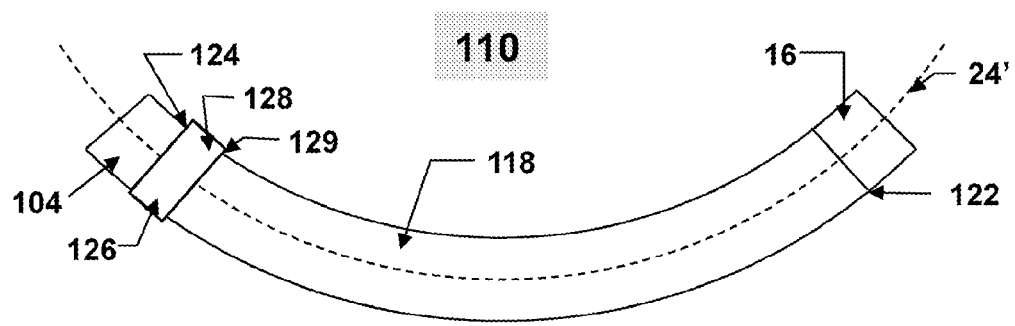
FIGS. 13A-13E are elevation views and FIGS. 13F-13G are views in cross section illustrating sequences of fabrication and features of fabrication according to the invention.
Figure 13B:
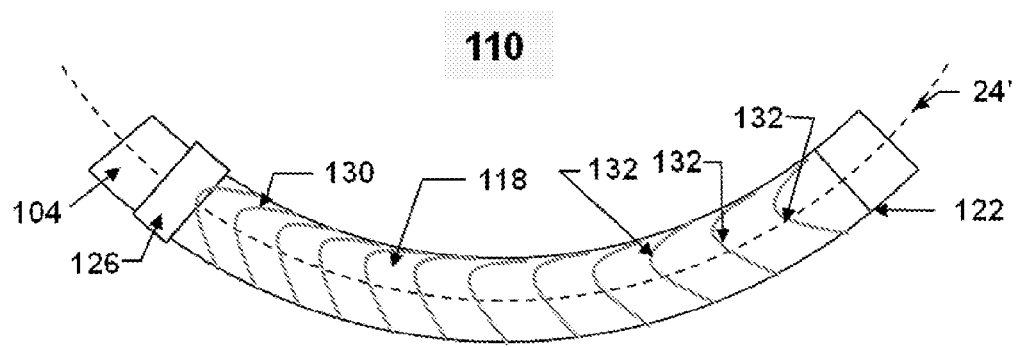
Figure 13C:
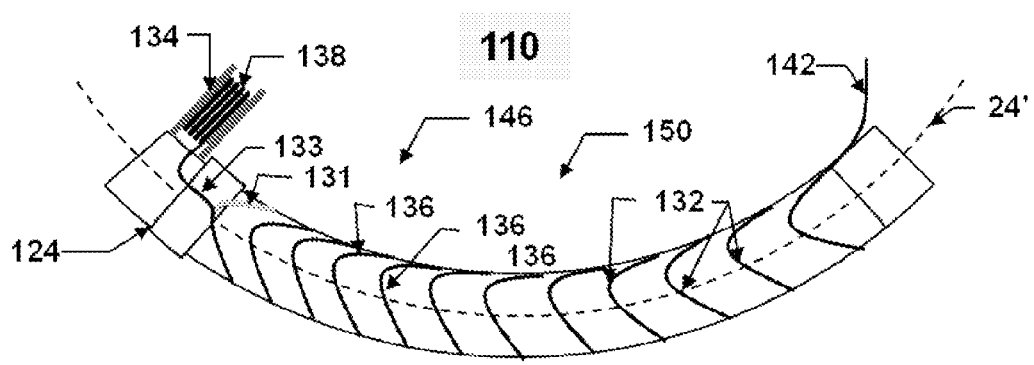
Figure 13D:
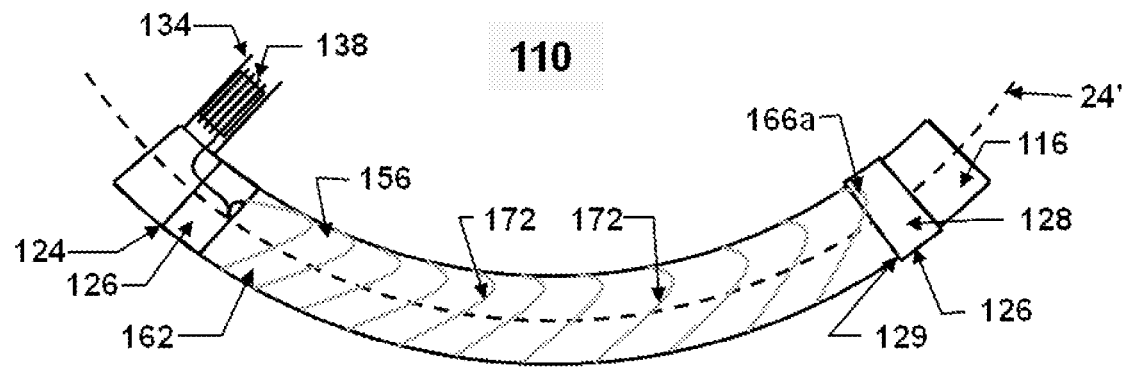
Figure 13E:
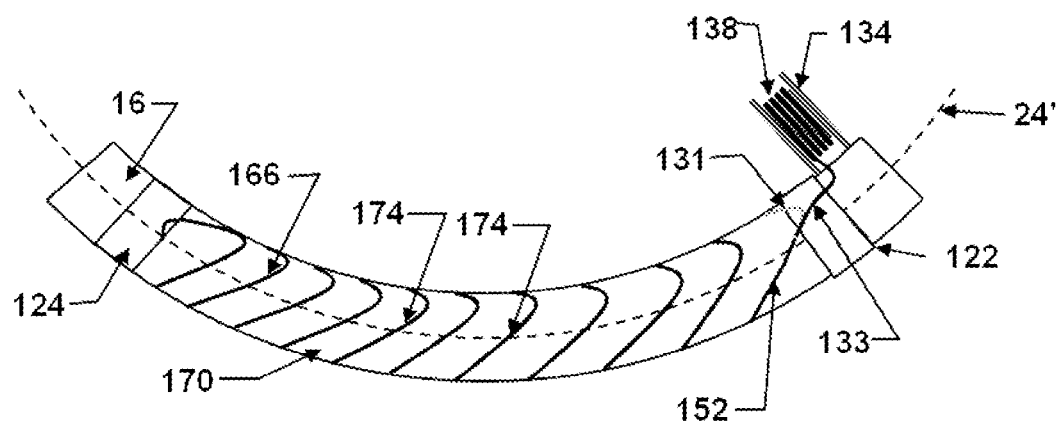
Figure 13F:
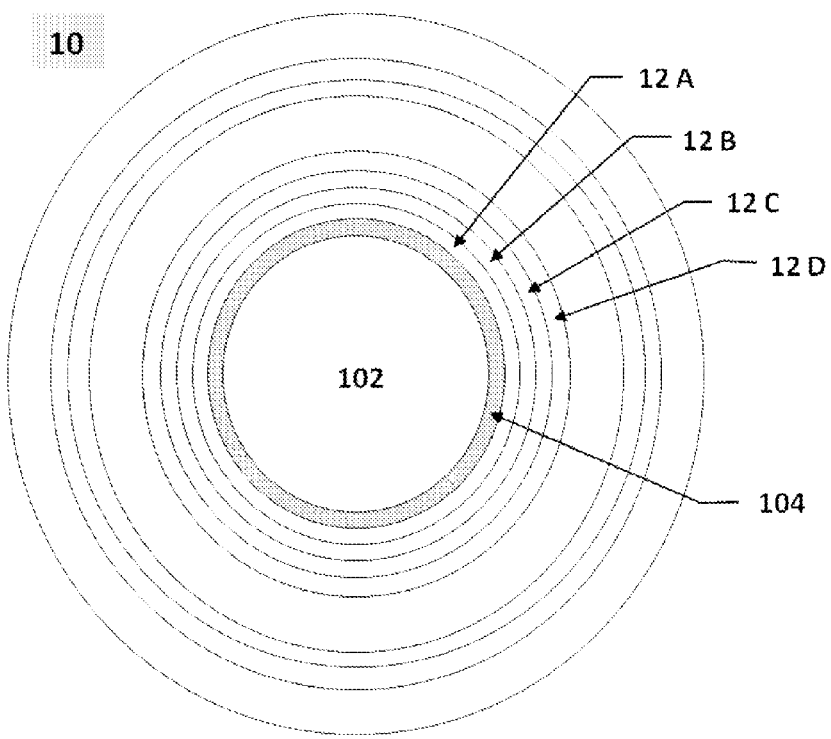
Figure 13G:
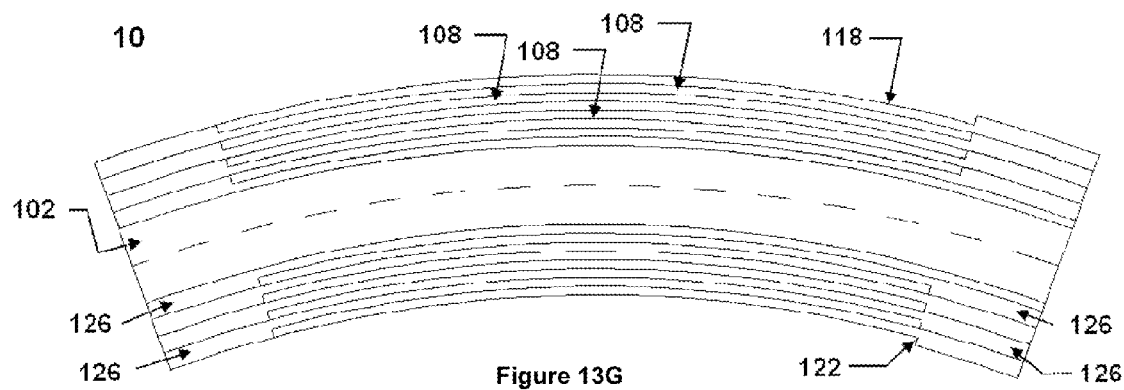

FIGS. 13A-13G illustrate fabrication features for construction of the coil 10 according to embodiments of the invention. The design incorporates multiple layers providing pairs of tilted double helix conductors configured about the curved axis 24'. FIG. 13F provides a view in cross section of the coil 10 along an arbitrary plane cutting transverely through the axis 24' and illustrating the aperture 102 formed within a core 104. The coil 10 includes multiple coil rows 12, including rows 12A and 12B shown in FIG. 8, other specific ones of which are also referred to herein with other reference numbers. Each row 12 comprises a helical conductor formed in an insulative layer. In planes transverse to the axis 24' each of the coil rows 12 is concentrically placed about the axis 24' and with respect to the other rows 12. Portions of the conductor in different ones of the rows 12 are electrically isolated from one another by one or more layers of the insulator as illustrated in the figures. The various layers of insulator when referenced generally or collectively are referred to as layers 108. Other reference numbers are used when referring to specific layers of insulator in the coil 10. The insulator may be a relatively rigid non-conducting composite material in which channels can be machined for stable positioning of the conductor in each coil row. However, the invention is not at all limited to such designs or to the arrangement of tilted helical patterns shown for the coil 10.

One exemplary fabrication sequence, suitable for manufacturing numerous embodiments of coils begins with formation and curing of a layer 108 of composite material about the core 104. The core may be a removable mandrel as shown in the figures or may be a permanent structure, such as a stainless steel cylinder which provides a beam tube during use of the magnet in a particle accelerator application or for creating a vacuum in the aperture. The mandrel may be dissolvable or chemically removable. In other embodiments, the core 104 may be a composite material formed, for example, of fiberglass resin and suitable for formation of one or more channels therein to define a core coil row, e.g., row 12A. When multiple channels are formed in the same row they may be interlaced with one channel providing an auxiliary function such as cooling of the conductor (not shown). The mandrel or the core may be insulative or conductive bodies. The illustrated core 104 is a removable shaft suitable for mounting on a Computer Numerical Control (CNC) machine in an automated process. A core may be formed of ceramic, composite material or other moldable or machinable material. Although illustrated embodiments suggest cores which are circular in cross section and of uniform aperture diameter, other geometries are contemplated.

As shown in FIG. 13A, a layer 108 of insulator comprising a composite material is formed on the core 104. Such a so-called lay-up may, for example, be a reinforced plastic comprising fibers, e.g., fiberglass, carbon or aramid, and a polymer, such as an epoxy or a thermosetting plastic. The layer 108 may be applied as a series of sublayers each comprising a thin, chopped strand or woven fiber mat through which a resin material permeates, or as a matrix of fiber particles and polymer. Thickness of the layer 108 is chosen based on numerous considerations including the thickness or diameter of the conductor to be placed on the layer, the desired depth to which the conductor is to be placed in the channel, and the minimum thickness of insulation between conductor material positioned in adjacent ones of concentric rows. The composite layer 108 is cured in a conventional manner and then machined to desired tolerances. A substantial portion of the cured and machined layer 108 is in the shape of a curved tube also referred to herein as a curved or bent cylindrical body 110. See again FIG. 13A, which illustrates that the body 110 has a major outer surface 118 which when viewed along a plane transverse to the axis 24' is circular in cross section. However, asymmetric geometries of the resulting coil may be fabricated in a similar manner. Generally, the layer 108 may be any tubular shape, having in some embodiments a central axis of symmetry or multiple thicknesses or variable shapes along an exterior surface. The aperture 102 within the layer 108 may also be in the shape of a circle (i.e., when viewed in a cross section taken along a plane transverse to the axis 24'), but more generally may be tubular and of arbitrary shape in cross section. As now described for the composite layer 108, all of the composite layers, which insulate portions of the conductor material formed in the same or in different coil rows, have first and second opposing end regions which, individually or collectively, are referred to as first and second coil ends 122, 124. The coil ends 122, 124 are formed about the coil aperture 102, shown in the cross sectional view of FIG. 13F as having a circular shape. The core 104 is illustrated as extending beyond each of the ends 122, 124 for purposes of mounting during the machining process, but it is to be understood that the core may be terminated at or near the coil ends.

A feature of the coil 10 is that the layer 108 and other layers formed thereover include a shoulder region 126, alternately positioned at one or the other of the coil ends 122, 124. In FIG. 13A, the shoulder region 126 is adjacent the coil end 124. See, more generally, FIG. 13G which illustrates, in a simple cross sectional view taken along a plane extending along the aperture 102, the series of insulator layers 108 wherein, for each layer 108, a shoulder region 126 is formed at one end 122 or at the other end 124 in an alternating pattern extending from the aperture 102 outward from the axis 24'.

The illustrated shoulder regions 126 are each in the form of a curved cylindrical shape, positioned more or less symmetrically about the axis 24'. The shoulder regions 126 may each have approximately twice the thickness of other portions of the layer 108 that extend along the major outer surface 118. The shoulder regions may be formed by positioning approximately twice as much composite material in the shoulder region relative to the other portions of the layer 108. The major outer surface 118 and the surface 128 may be shaped by machining the layer 108 after the composite has cured. As illustrated, the shoulder region 126 may be defined with an abrupt, step-like transition 129 between the two surfaces 118 and 128 or the transition between the surfaces 118 and 128 may be gradual, along a sloped surface formed between the surfaces 118 and 128.

Referring next to FIG. 13B, a channel 130 along the path of a tilted helix is defined in the layer surface 118, creating a series of channel loops 132. In this example each of the loops 132 may be approximately elliptical in shape, it being understood that the individual loops are not closed shapes because they are portions along a continuous helical pattern. Collectively, the channel loops 32 define a path for placement of a segment of conductor which corresponds to a first row of coiled conductor. The loops may have more complex shapes than illustrated in order to define or accommodate modulations and other variations in a desired conductor path. As illustrated, one or more of the loops 132 of the channel 130 may extend into the shoulder region 126. The channel 130 is cut or otherwise formed in the cylindrical outer surface 118 so that it extends a predetermined depth, d, into the layer 108 to define a conductor path. The actual depth of a portion of the channel, which is below the outer surface 118, may be equal to all or part of the thickness of the conductor to be placed therein, so that the conductor may be partly or entirely positioned within the channel 130.

The path defined by the channel 130 continues along the major surface 118 into the shoulder region 126. Portions of the channel 130 formed in the shoulder region 126 continue along a transition ramp that extends from the shoulder surface 128 to a variable depth which effects a continual transition in the channel 130, from a position at one level (e.g., a given depth below the surface 118) in the layer 108 to another level in the shoulder region 126 which corresponds to the intended depth of a yet-to-be-formed channel in a next of the layers 108 of insulator to be placed about the layer 108 after conductor is positioned in the channel 130.

A feature shown in FIG. 13C is the formation of two paths, i.e., a channel fork, wherein the channel 130 extends along two different directions. As the channel depth decreases in the shoulder region, the channel bifurcates into a first path 131 that continues along the surface 128 to a transition 129 and a second path 133 that continues in a direction away from the transition 129. With this arrangement, after a conductor is placed in the channel 130, the conductor may be positioned along the second path 133 until the channel for the next coil row is formed.

Still referring to FIG. 13C, a winding process begins with positioning a spool 134 of conductor 138 at a first of the end regions 122. The spooled conductor has a continuous length of sufficient distance, end to end, to turn conductor through all of the channel loops 132 of the coil 10, thereby defining a series of conductor loops 136 in every one of the concentric coil rows in a splice-free manner. In this regard, reference to a conductor as splice-free means that, although a conductor segment of given length can be formed of multiple, connected sub-segments, a splice-free conductor is one in which there are no discrete connections effecting continuity along the length. This is typically because the entire length of the conductor has been initially formed and then preserved as one body having an uninterrupted and continuous length. By way of example, a filament may be extruded to at least the given length. A splice-free conductor is not one formed from multiple segments which have been electrically separate from one another prior or during installation in a conductor assembly (such as the assembly 10) and then have been coupled together (e.g., such as by mechanical means or by soldering or by welding) and thereby characterized by one or more detectable junctions that provide for electrical continuity along the given length. Rather, a splice-free conductor segment of given length is formed as a single unitary body without requiring during formation of the assembly any connection among smaller lengths thereof to effect continuity. In the case of multifilament conductor, a splice-free multifilament conductor segment of given length is also one which is formed as a single unitary body without requiring during formation of the assembly any connection among smaller lengths thereof to effect continuity. Notwithstanding the foregoing, the term segment, used in the context of a splice-free conductor of given length, may refer to one or more portions of the length or the entire length.

A first end 142 of the conductor 138 is placed in a fixed manner near the end 122 of the layer 108 and a first segment 150 of the conductor 138 is positioned in the channel 130. The conductor segment 150 is shown after generating all of the loops 136 in the coil core row 146, i.e., a first helical row of conductor loops 136 which is formed in the channel 130 on the layer 108.

With the first segment 150 of conductor 138 placed in the channel 130, the conductor initially follows the second path 133 on the shoulder portion 128 with the spool 134 having been mounted on the core 104 at the coil end 124. The placement of the conductor 138 in the path 133 and positioning of the spool 134 on the core allow the conductor on the spool to remain attached to the conductor segment 150 while a next composite layer is formed and tooled to generate another level of channel. By way of example, the core may be turned with the spool attached thereto in order to shape a next tubular surface of the next composite layer and cut the channel. Once the next level of channel is formed, the conductor placed in the path 133 is removed and placed in the first path 131 to continue the winding process along the next channel in a direction from the coil end 124 toward the coil end 122.

Placement of the conductor in the path 131 effects a 180 degree turn of the conductor 138 about the end 124 in order to position the conductor for insertion in another channel in order to form a second coil row. Accordingly, FIG. 13D illustrates a layer 156 of composite material formed over the core row 146 and layer 108, after having been cured and machined to form a suitable curved tubular surface. The layer 156 includes a machined outer surface 162 also having a curved tubular shape into which a second channel 166 is machined. The layer 156 further includes a shoulder region 126 adjacent the coil end 122 and having features as described for the shoulder 126 which forms part of the layer 108, i.e., being twice the thickness of the portion of the layer 156 within the outer surface 162, and having a cylindrical outer shoulder surface 128. The channel 166 is formed, e.g., by machining, in the surfaces 162 and 128 to define a second helical path for receiving a second segment 152 of conductor.

When the layer 156 is turned, e.g., on a CNC machine, the spool 134 and associated conductor 138, being attached to the core 104, turn with the layer 156 as the channel 166 is machined therein. As described with regard to the layer 108, the shoulder region 126 of the layer 156 may be defined with an abrupt, step-like transition 129 between the two surfaces 162 and 128 or the transition between the surfaces 162 and 128 may be gradual, along a sloped surface formed between the surfaces 162 and 128. Also, as described for the shoulder of the layer 108, the channel 166 includes a portion formed in the shoulder region, extending from the surface 162 and extending toward the shoulder surface 128. The channel depth in the shoulder region 126, with respect to the surface 128, ranges in depth as discussed with respect to FIG. 13C. The portion of the channel extends a variable depth below the outer surface 128 of the layer 156 up to a predetermined depth below the outer surface and may continue along the surface 128 to the transition 129. Also as described with respect to the layer 108, the portion of the channel along the surface 128 includes two paths wherein the channel 166 extends along two different directions, one of the paths 131 continuing to the transition 129 and the other path 133 continuing in a direction away from the transition 129 so that the conductor may be initially placed in the path 133 and then, after channels for the next coil row are formed, be placed in the path 131.

FIG. 13E illustrates the partially fabricated coil 10 having the segment 152 of conductor 138 placed in the channel 166 to provide a second helical coil row 170. Both the channel 166 (see FIG. 13D) and the coil row 170 are helical, with the channel 166 comprising loops 172 and the row 170 comprising loops 174 of conductor 138. The tilt angle of the channel and conductor loops 172 and 174 is opposite the tilt angle of the channel and conductor loops 132 and 136 of the coil core row 146. Pre-definition, e.g., by machining the channel 166, of the coil path for the second coil row 170, enables fixed placement of the conductor segment 152 along the curved surface 62 of the tubular shaped layer 156. This arrangement avoids slippage and minimizes other forms of movement of the conductor length as it extends beyond the core row 146. Also, as seen in FIG. 13E, with the segment 152 wound along the channel 166, the spool 134 is next positioned on the core 104 adjacent the coil end 122, with a portion of the conductor 138 positioned in the path 133 while the next layer of insulator is formed and a channel is formed therein.

A series of additional helical coil rows 12 are formed over the rows 146 and 170. Initially with the conductor 138 extending from the segment 152 at an end 122 of the layer 156, a first in a series of additional insulator layers 176 and a first in a series of additional coil rows 12 are formed, and the alternating sequence proceeds in a manner similar to that described for forming the initial sequence of the composite layer 108, the coil core row 146, the composite layer 156 and the coil row 170. The spool is alternately affixed to different coil ends 122, 124 while each next insulator layer 176 is fabricated with a channel therein. In other embodiments, the insulator layers 108, 156, 176, may be pre-fabricated, with channels formed along the surfaces, and positioned over the prior-positioned layers. The pre-fabricated layers may be slid over one another or may be assembled from components having, for example, a clam-shell configuration, wherein each layer is formed of two components which, when placed together, form a curved tubular shape suitable for the coil assembly of FIG. 8.

The described fabrication sequence enables formation of splice-free magnetic coils in a helical, e.g., double helix, configuration around a curved axis. With this sequence it is no longer necessary to route the conductor from a lower insulative level radially upward to protrude out from the lower level in a region where the next insulative level is to be formed. The fabrication sequences disclosed herein may be fully automated with conventional equipment such as a CNC machine. The ability to build sequential coils rows with splice-free conductor adds reliability and reduces potential concerns relating to solder joints and contact resistances.

The term "conductor" as used herein refers to a string-like piece or filament of relatively rigid or flexible material, commonly referred to as cable or wire, being of the type comprising either a single conductive strand or multiple ones of such strands grouped together as one functional conductive path. The term multi-strand conductor refers to such a conductor formed as a single identifiable unit and composed of multiple conductive strands which are twisted, woven, braided or intertwined with one another to form an identifiable single unit of wire. Reference to one multi-strand conductor means application of the single identifiable unit as one functional unit and excludes having multiple ones of the individual functional units grouped together functionally when the multiple ones are not twisted, woven, braided or intertwined with one another. As used herein, multi-strand conductor only refers to arrangements wherein the multiple strands are twisted, woven, braided or intertwined with one another to form the single unit. According to the invention, multi-strand conductor may take the form of conductor that embodies a circular or a non-circular contour in cross section.

Numerous cross sectional channel shapes and conductor shapes may be used in constructing the coil 10. The conductor 138 may be a solid core or a multi-strand conductor, having a circular shape in cross section, a square shape in cross section, a rectangular shape in cross section or a relatively flat profile, tape-like form. A multi-strand conductor having A rectangular shape cross section may be a braided copper conductor or a Rutherford type cable used for superconductor applications. The conductor may be, for example, a YBCO-based high temperature superconductor wire having a tape-like profile with a width dimension in a range, for example, between 2 mm and 5 mm, and a thickness in the range, for example, of 0.09 mm to 0.3 mm.

Generally, embodiments of the invention now provide a channel, such as one of the channels 130 or 166, in each of multiple conductor rows of a coil, having a profile suitable for accommodating a conductor of desired cross sectional shape. Providing such a channel may result in one or more additional benefits depending on the corresponding channel profile.

For example, with a conductor having a circular cross section, the channel may have a corresponding circular shape with a width sized very close to or the same as the conductor diameter, and a depth of approximately one half the conductor diameter. With this arrangement, and a subsequent overcoat of another layer of composite, such as wherein one of the layers overcoats the conductor segment and portions of the layer, it is possible to precisely define placement of the conductor segments and constrain the segments from movement in the presence of high magnetic fields. This placement can be totally independent of conductor placement in an underlying coil row.

Figure 14:
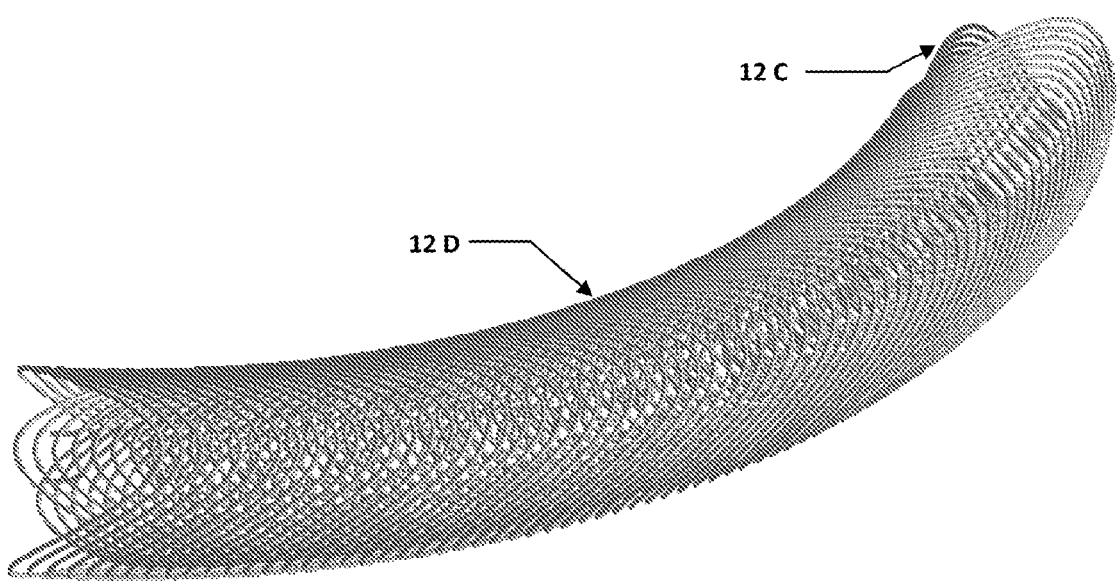
FIG. 14 illustrates a double helix pair of coil rows useful for formation of a combined function magnet according to the invention.

With reference to FIG. 14, there is shown an exemplary double helix pair of magnet coil rows 12C and 12D (having opposing tilt angles) following a helical path about the axis 24' and comprising, relative to the loops 136 of FIG. 13, a higher frequency sinusoidal component, e.g., a quadrupole component, in each loop 202 thereof. Multiple ones of the illustrated rows 12C and 12D may be used in addition to multiple ones of the rows 12A and 12B to form a combined function magnet assembly for generating dipole and quadrupole fields, e.g., as needed for Fixed Field Alternating Gradient (FFAG) accelerators. Embodiments of the invention are not limited to the afore-described double helix configuration.

If needed, the double-helix geometry also allows manufacturing of magnets formed along curved axes with precisely designed combined field functions. For example, a design can superimpose over the same segment of a curved axis both a dipole field for bending a beam trajectory and a quadrupole field for focusing the beam. The perspective view of FIG. 14 shows a pair of coil rows 12C and 12D suitable for assembly in the coil 10 (see, also, FIG. 13F) wherein each row has a wiring pattern for generating a quadrupole field. As illustrated, the rows 12C and 12D are adjacent one another to create a double helix configuration about the axis 24'.

The fabrication features described for the embodiment of FIG. 13 include formation of channels 130 comprising individual channel loops 132. A process is now described for machining such conductor channels in coil rows which follow a curved axis or for which the aperture radius varies as a function of position along an axis. The following exemplary process enables machining of such channels in a support structure or core providing a curved aperture having a constant radius of curvature and a total bending angle of about 90 degree. The same process is applicable to other geometries, in particular those with changing aperture radii and varying radii of curvature.

Figure 15A:
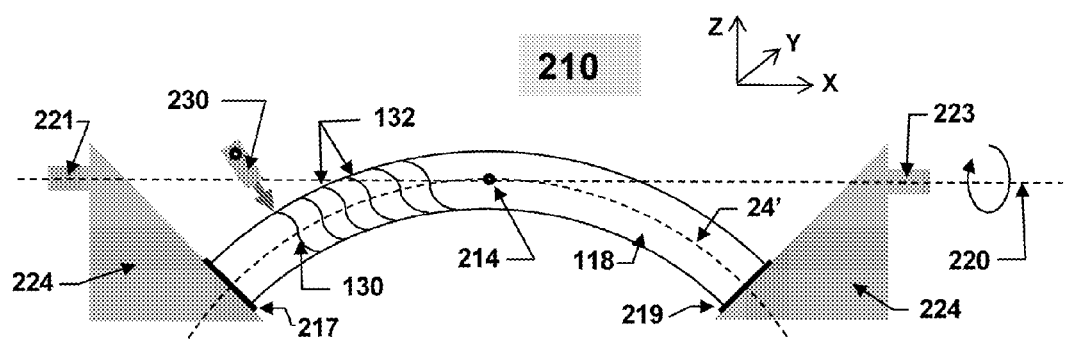
Figure 15B:
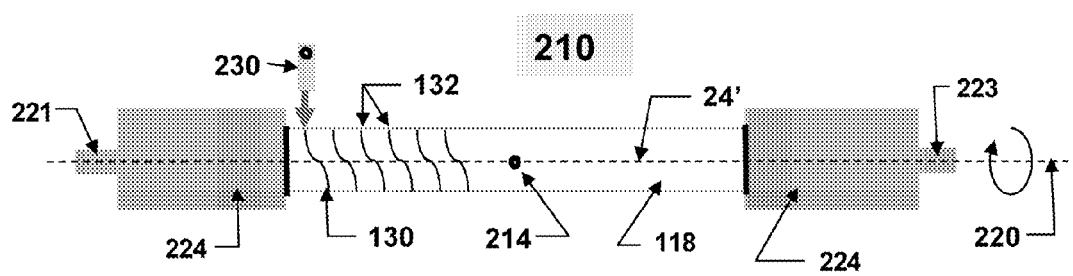
Figure 15C:
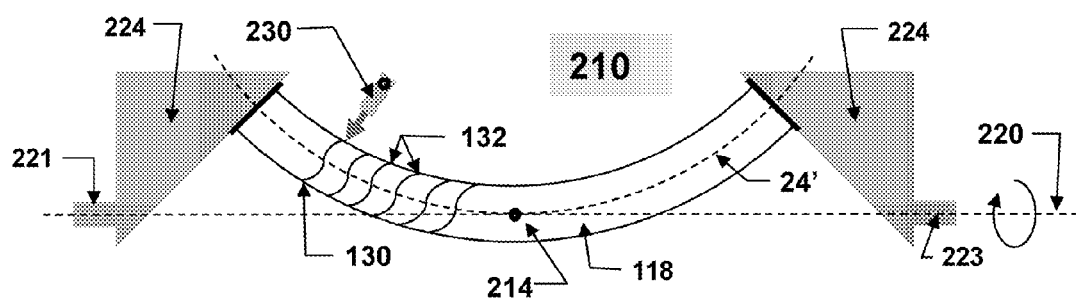

A machining process, suitable for incorporation with the fabrication process of FIG. 13 begins with provision of a curved support structure corresponding to a partially fabricated coil assembly. The structure may as now illustrated be of a shape conforming to the desired magnet geometry. FIGS. 15A 15B and 15C illustrate in partial schematic views a partially formed coil assembly 210 mounted on a tooling machine during an intermediate stage of manufacture to create a magnet coil assembly such as the coil 10. The partially formed coil assembly 210 comprises one or more coil rows 12 (e.g., row 146 or row 170 of FIG. 13), one of which is along an exposed surface shown in the figure. The coil rows 12 may be formed, for example, in a resinous composite layer as described in FIG. 13. According to other embodiments the assembly may be fabricated with a Direct Helix manufacturing process such as described herein. The assembly is mounted for rotation about the centerpoint 214 of the curved axis of symmetry 24'. The center point coincides with a straight axis 220 of rotation on a CNC tooling machine 224. The assembly 210 rotates around the axis 220 during a machining process which defines a channel for placement of conductor in accord with a predefined wiring pattern in each coil row. That is, first and second opposing ends 217 and 219 are each fixedly secured to a chuck 221 or a tail stock 223. The chuck and tail stock are aligned with the straight axis 220 while the ends 217 and 219 are in offset positions relative to the chuck and tail stock so that the axis 24' can rotate about the axis 220. With this arrangement the rotation of the assembly 210 about the axis 220 permits precision machining along a curved surface. A feature of the invention is that geometric irregularities along the surface 118 have minimal or no effect on the precision because the tooling machine can be programmed to generate a space curve relative to the predefined central axis 24'. For example, when fabricating such an intermediate structure, which may be in the shape of a tube, or curved cylinder, formed about a central axis of symmetry, tolerances and errors in the fabrication process result in topological variations along the surface. These variations are departures from the ideal symmetry of the surface about the central axis. By forming channels, e.g., for placement of conductor therein, based on spatial relationships between a defined axis and the desired positions of points along the channel, manufacturing precision for generating the channel at each point is independent of topological variations along the surface. A channel is formed according to a series of points each having a predefined distance from an axis of symmetry. For points in the series, the predefined distance is a distance measurable along a plane transverse to the axis 24' and passing through the point. Although numerous other techniques are suitable, forming of the channel may include application of a cutting tool such as a router bit along the surface. The variable router position is based on distances from an axis, which is not necessarily an axis of symmetry. Consequently for embodiments wherein the channel does not penetrate through the structure being tooled (as is the case for some embodiments fabricated according to the Direct Helix manufacturing process), the resulting position of the channel relative to the axis is primarily subject to manufacturing tolerances associated with positioning of the tool relative to the axis. For such embodiments, channel position is independent of topological variations along the surface.

The channel 130 may be may be machined in a resinous core support. This is followed by placement of conductor therein, and the sequence described in FIG. 13 is repeated, including formation of a layer thereover which is machined to create another coil row for receipt of another level of conductor. FIG. 15A illustrates the assembly at a first position of rotation about the axis 220 showing a view wherein the axis 24' is in a plane parallel with the view. FIG. 15B illustrates the assembly at a second position after a ninety degree rotation about the axis 220. FIG. 15C illustrates the assembly at a third position after a one hundred eighty degree rotation about the axis 220 relative to FIG. 15A, wherein the axis 24' is again in a plane parallel with the view.

The channel 130 may be cut with a high speed router bit 230 that is mounted for displacement in accord with a Cartesian (X,Z) coordinate system relative to the axis 220 for displacement about the axis 24'. The assembly 210 rotates around the axis 220 which axis is parallel to the X axis such that the assembly 210 undergoes rotational displacement independent of the router bit displacement. The router position is adjustable with respect to the surface in such a way that the tip of the router bit follows the required channel pattern along the surface of the coil form to create a channel of defined depth. The channel pattern is determined based on the transformations and optimizations that begin with Equations 3 and result in a coil pattern for each of the rows 12.

The coordinated movement of the router bit 230 and the rotating assembly 210 is based on a series of points generated for the coil pattern wherein movement along each axis is independent. For example, with the assembly rotating about the axis 220, it is necessary to impart a displacement along the X axis to follow the intended pattern along the layer surface 118. However, movement of the rotating surface 118 requires movement of the bit 230 along the Y and Z axes to assure proper tracking of the bit during rotation. Further, accuracy of machining is enhanced by performing coordinated interpolations and movements in accord therewith along the multiple axes to assure smooth continuous movement of the bit along the surface 118 to replicate the modeled pattern resulting from the optimization process of FIG. 10.

In the embodiment of FIG. 15 for the example assembly 210, a rotational movement of the bit in the X-Z plane enables positioning of the bit so that at any point it is always perpendicular to the tangent vector along the surface 118 at that point while the assembly 210 rotating. The tool has rotational freedom in a plane to form the channel with a profile that has a central axis which is always perpendicular to a tangent vector along the surface. As the direction of the tangent vector changes the tool rotates accordingly. This degree of freedom can accommodate varied channel shapes such as for receiving conductors having shapes in cross section that are not circular, e.g., that might be rectangular. The tool can also vary from an angle perpendicular to the tangent vector along the surface in order to accommodate conductor shapes of varied design such as disclosed in U.S. application Ser. No. 12/061,813.

For the example shown in FIG. 15, when the router bit 230 rotates in the XZ plane any such movement affects the X and Z coordinate position of the bit and appropriate (X,Z) displacements must be imparted to the bit to offset these displacements and thereby achieve the required (X,Z) position relative to the axis 24'. In order to machine grooves into the bent surface of the assembly 210 with a required geometry, it is therefore necessary to supply the machine controller with point coordinates along each variable axis. The number of point coordinates that are needed for the machining process depends on the required precision of the channel to be machined and can reach a million points, before interpolation, for a large coil such as an assembly having an arc length on the order of one meter and an aperture diameter of 10 cm. For coil designs wherein the axis of symmetry is not in a single plane, an additional degree of freedom may be needed to control the angle of the bit 230 with respect to the layer surface.

Figure 15D:
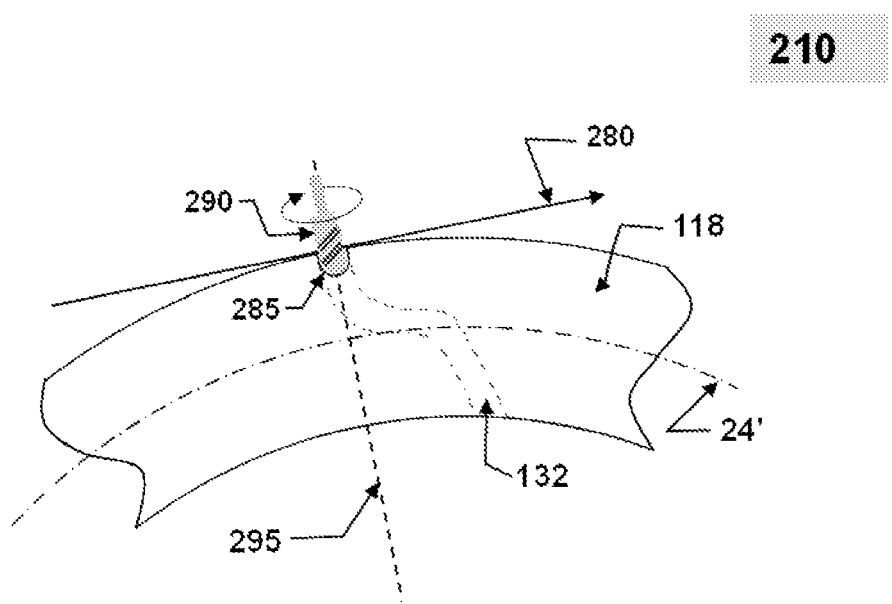
FIG. 15D illustrates a view in cross section of a channel during fabrication.

FIG. 15D is a view in cross section showing an exemplary portion 285 of the channel 132 extending into the surface 118 of the assembly 210. The view is along a plane transverse to the direction of the channel. In this embodiment a router bit 290 is positioned at a ninety degree angle relative to a tangent vector 280 along the surface. The resulting channel is formed about an axis of symmetry 295 which is orthogonal to the surface 118. The channel portion 285 is shown extending a depth d below the surface 118. In other embodiments, the channel may include a flat lower surface and vertical side walls as described in Ser. No. 12/061,813 and the axis of symmetry 295 may be at an angle with respect to the tangent vector to accommodate the conductor in accord with the teachings of Ser. No. 12/061,813. Notwithstanding such changes in the angle of the axis of symmetry 295, (wherein along the trajectory of the router bit 290, the bit is positioned at a variable angle relative to the aforedescribed ninety degree angle), the channel is also formed according to a series of points each having a predefined distance from an axis of symmetry. As described for the illustration of FIG. 15, the predefined distance is a distance measurable along a plane transverse to the axis, e.g., axis 24', and passing through the point. Although numerous other techniques are suitable, forming of the channel may include application of a cutting tool such as a router bit along the surface. The variable router position is based on distances from an axis, which is not necessarily an axis of symmetry. Consequently for embodiments wherein the channel does not penetrate through the structure being tooled (as is the case for some embodiments fabricated according to the Direct Helix manufacturing process), the resulting position of the channel relative to the axis is primarily subject to manufacturing tolerances associated with positioning of the tool relative to the axis. That is, for such embodiments, channel position is independent of topological variations along the surface. When the conductor placed in the channel is not of a circular shape in cross section, e.g., rectangular, with the axis of symmetry 295 having a variable angle with respect to the tangent vector, the series of points having predefined distances from an axis, e.g., like axis 24', may be a function of the conductor shape and the variable angle. That is, the pattern conforms with necessary displacements from the axis to assure generation of desired multipole orders and suppression of undesired multipole orders.

With application of the optimization procedure of FIG. 10, as well as other optimization procedures described herein, it becomes possible to reduce the magnitude of systematic errors, e.g., removal of undesired multipole components, to the extent that the predominant source of error is error which stems from manufacturing tolerances, referred to herein as random error. As discussed above, such manufacturing tolerances can be reduced by tooling the channels relative to an axis so that positioning of the channel and positioning of the resulting conductor are primarily subject to manufacturing tolerances associated with positioning of a cutting tool relative to the axis. With this approach, manufacturing tolerances are independent from, i.e., not a function of, topological variations along the surface. In illustrated examples, with a channel formed through a surface and into a structure, the channel contour is derived directly from a wiring pattern based on distances measured from a central axis.

Consequently, using an optimization procedure such as described in FIG. 10 during a manufacturing process such as illustrated in FIGS. 13 and 15, systematic errors can be reduced to levels smaller than the errors associated with manufacturing tolerances. Further, by tooling a channel based on displacement relative to an axis, in accord with the examples of FIG. 15, manufacturing tolerances can be achieved on the order of 0.01 mm. Tolerances on the order of 0.001 mm or less also may be achievable.

Figure 18:
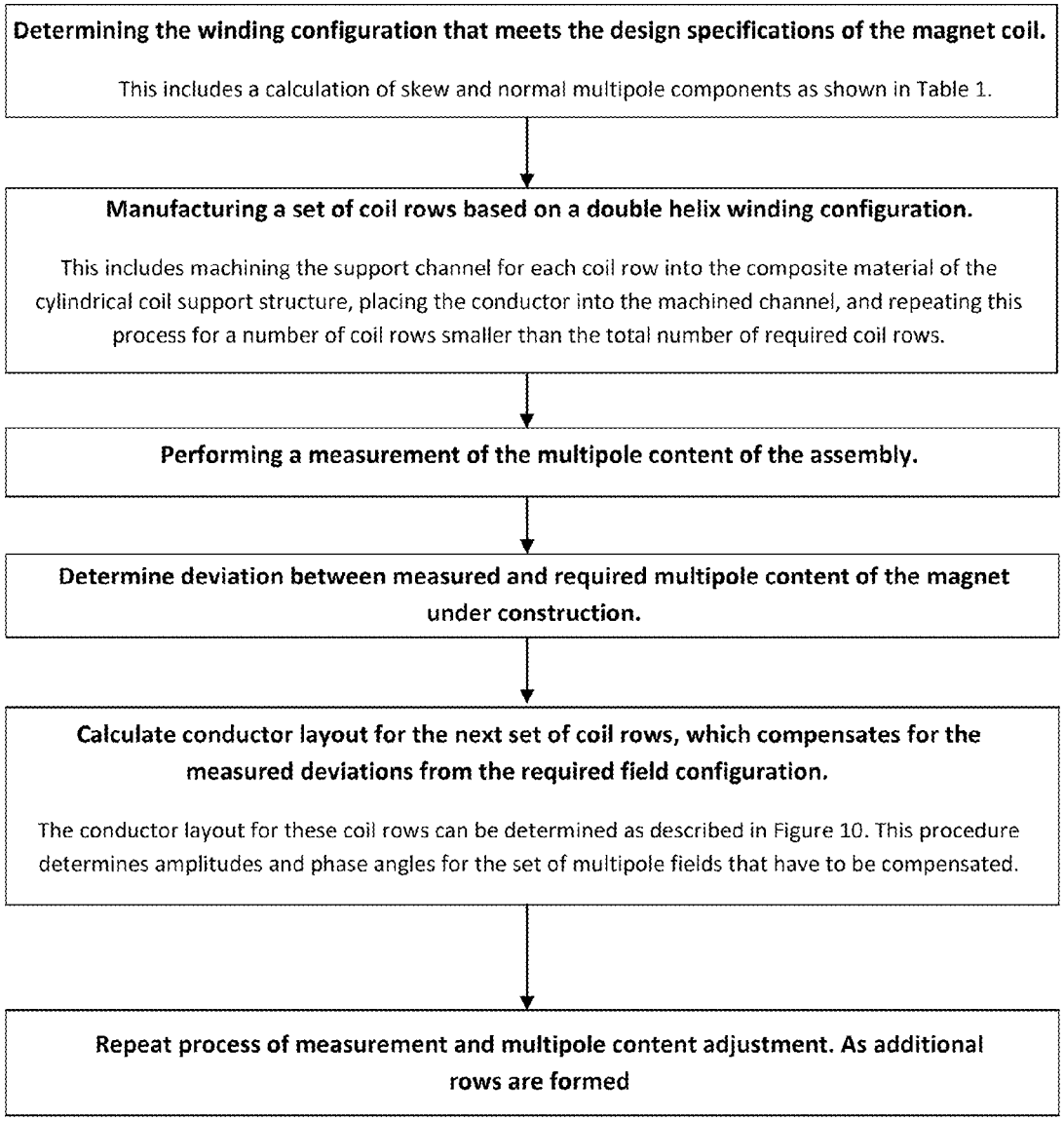
FIGS. 18 and 19 illustrate alternate embodiments of an iterative process according to a methodology for determining values of geometric parameters for construction of coil rows according to multipole component specifications.

Still, it is possible that manufacturing variations will introduce random errors that can result in generation of multipole components having undesirably large influences relative to the suppressed systematic errors. This is especially true when an optimization procedure is employed to remove systematic errors such that manufacturing tolerances are the predominant source of error. According to another set of embodiments, applicable in applications requiring greater field uniformities, a procedure suppresses such unwanted terms as they occur during manufacture. An example process, in accord with the flow chart of FIG. 18, can be employed during the fabrication processes shown in FIGS. 13 and 15. Manufacturing errors in a complete conductor assembly, comprising multiple coil rows, are an accumulation of errors introduced during the fabrication of each coil row. Recognizing this, once one or more conductive coil rows 12 are formed, a field calculation is performed for the partially fabricated structure. For example, a current may be run through the one or more coil rows 12 to measure field magnitudes and characterize the field quality generated by the limited number of the rows in the partially fabricated assembly.

If multipole field components of unwanted magnitude are detected, these can be offset by introducing modulations in the next layers using the described method. That is, the deviation between calculated and measured field values are determined and, as described in greater detail in FIG. 10, optimized values are determined for a set of parameters which offset the unwanted magnitudes. The process of measuring deviations in fully formed coil rows 12 and introducing offsetting corrections in an overlying layer may be repeated as the assembly proceeds with formation of the additional coil rows 12. A feature of this process is that the effects of manufacturing tolerances on field quality decrease as a function of radial distance. Assuming the manufacturing tolerance is the same for all coil rows 12 ranging from an inner most coil row to an outermost coil row, errors associated with outer coil rows will have less influence on field quality in the aperture region than will errors associated with outer coil rows.

A fabrication method which suppresses generation of unwanted multipole field orders begins with determining a winding configuration that meets the design specifications of the fully fabricated conductor assembly, e.g., magnet coil. This includes a calculation of skew and normal multipole components as shown in Table 1. Next, one or more coil rows 12 are formed. These may be multiple pairs of double helix coil rows. For the process shown in FIGS. 13 and 15, fabrication includes machining a support channel for each coil row in a layer of composite material of the coil support structure. The structure may be curved as illustrated or in the form of a straight cylinder, or may include flared regions as described hereafter for still other embodiments. The conductor is placed in the machined channel, and the process shown in FIGS. 13 and 15 is repeated to create a desired number of coil rows, fewer than the total number of coil rows in the completed assembly. With this partially fabricated structure, measurements are made of the multipole content. The measurement can be done with well known techniques, e.g. using a rotating pickup coil in the aperture of the coil. A Fourier analysis of the voltage induced in the rotating pickup coil allows calculation of the multipole content of the fabricated coil rows. Such techniques can provide accuracies of measurement for higher-order multipole fields on the order of $10^{-5}$ relative to the main multipole component.

With the measured data, deviations are determined, for each multipole order, between measured and required multipole content (e.g., in terms of magnitude) of the magnet under construction. With this data wiring patterns for one or more of the next coil rows are calculated in a manner which compensates for the measured deviations from the required field configuration.

The conductor layout for these coil rows can be determined as described in FIG. 10 except that when the assembly is performed along a straight axis, no bending transformation is performed: Generate each helical pattern in accord with the functions $X(\theta)$, $Y(\theta)$ and $Z(\theta)$; calculate the multipole content of the winding configuration; generate an objective function, e.g., $$\chi^2(\varepsilon_2, \ldots, \varepsilon_n) = \sum_{k=2}^{kmax} [A_k^2(\varepsilon_2, \ldots, \varepsilon_n) + B_k^2(\varepsilon_2, \ldots, \varepsilon_n)]$$

which depends on the unwanted multipole field components, i.e., based on determined deviations, and which reaches a minimum when the deviations reach desired minimum values; and modifying parameters to incorporate values of $\varepsilon_2, \ldots \varepsilon_n$ which result when he function reaches a minimum. With respect to this process and the process of FIG. 10 it may not be necessary for the minimum reached by the objective function to be an absolute minimum. This procedure determines modulation components (amplitudes and phase angles) that are introduced into the wiring patterns for the one or more of the next coil rows to offset measured deviations from the required field configuration. As manufacturing continues one or more additional ones of the total number of coil rows are formed about the support structure to continue fabrication of the assembly. Also as manufacturing continues the same process of measurement, determination of deviations and calculation of offsetting modulation components may be repreated. Such a process of providing adjustments in outer coil rows to compensate for manufacturing errors in inner coil rows significantly decreases deviations of higher-order multipole fields of the complete coil from their design goal. The process may provide consecutive adjustments. The process converges to high field fidelity since higher-order multipole fields, i.e. quadrupole, sextupole, etc., decrease according to $(R/R_o)^{n-1}$, where r is the radius of the conductor, $R_o$ is the reference radius and n is the multipole order. This factor increases rapidly for the outer rows and a given reference radius. Placement accuracy is therefore less important for the outer coil rows, which are farther way from the reference radius and conductor placement accuracy is less critical for the outer coil rows.

Figure 12A:
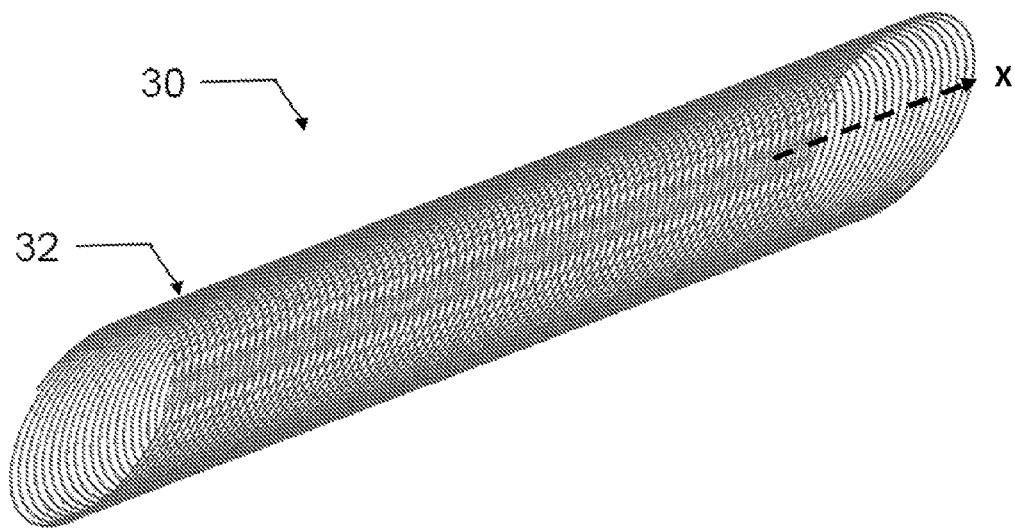
FIGS. 12A, 12B and 12C provide, respectively, a perspective view, a view in cross section about an axis of symmetry and a view in cross section along the axis, of a magnet according to an embodiment of the invention.
Figure 12B:
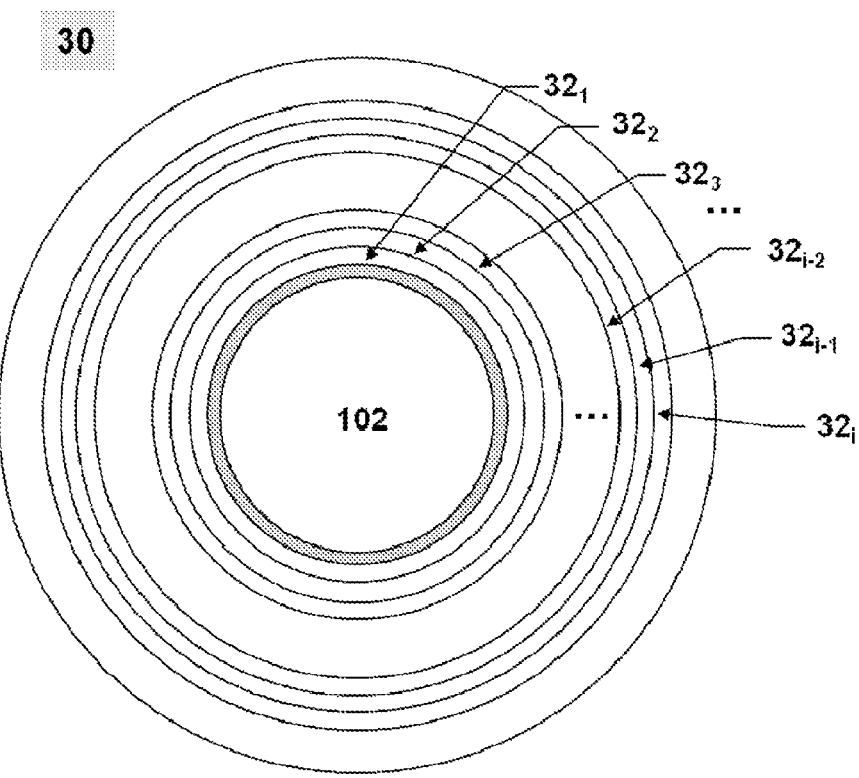
Figure 12C:
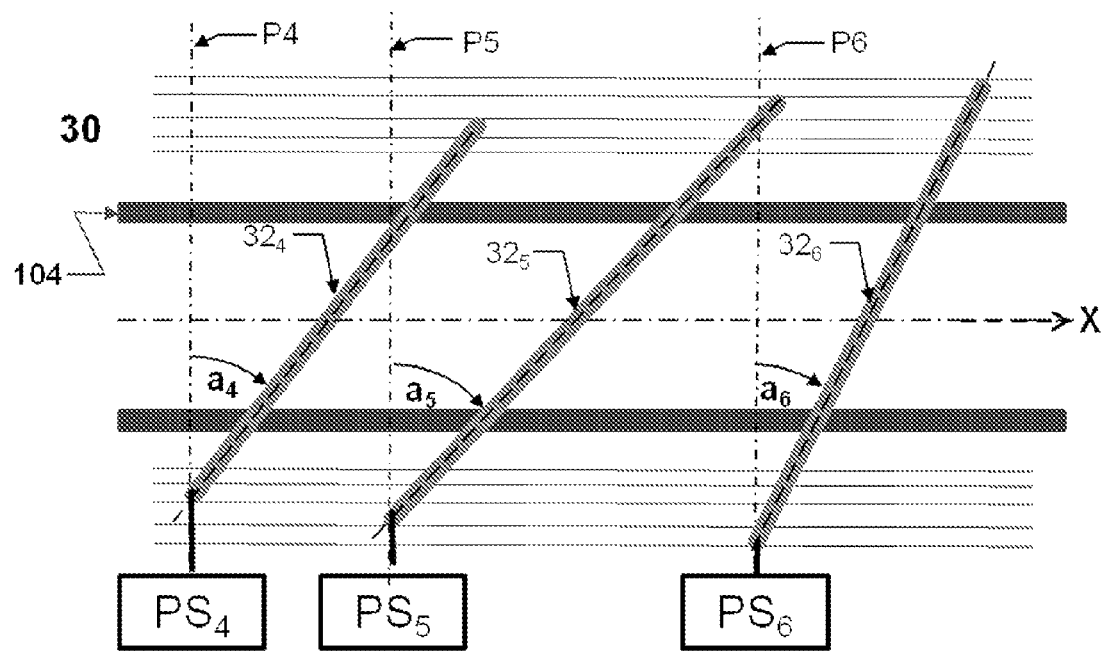

In the partial view of FIG. 12A, a coil magnet 30 is formed along a straight axis X consisting of multiple coil rows 32 (only one of which is shown) in accord with equations 3 and n=1, the row having an exemplary 100 turns and a coil aperture radius of 25 mm. FIG. 12B illustrates the magnet 30 in a cross section taken along a plane transverse to a point along the axis X, illustrating that the magnet 30 is an assembly comprising an arbitrary number of coil rows 12, formed about one another and an aperture 102. A feature of the magnet 30 is that if a field is generated in the magnet there will be a net axial field component. This is to be compared with a double helix design in which coil rows are provided with opposing tilt angles to cancel axial fields and maximize fields in planes transverse to the axis of symmetry. According to the embodiment of FIG. 12 each of the coils is configured with values of $A_n$ which impart a net axial field component in the same direction along the axis X so that the net axial field component of the magnet 30 is the sum of the magnitude of the axial field component generated by each coil row $12_i$. In the example embodiment, all of the $A_n$ values have the same sign and therefore each coil row "tilts" in the same direction with respect to a plane transverse to the axis. That is, with reference to FIG. 13C, all coil rows exhibit a tilt in the same direction as shown for the conductor loops 136, instead of alternate rows exhibiting an opposing tilt as shown for the loops 174 of FIG. 13E. See also FIG. 12C, a partial schematic view showing only one exemplary conductor loop $34_i$ in each of three consecutive coil rows $32_i$ (i=4, 5, 6). Each loop $32_i$ in each row is representative of the series of loops in that coil row $32_i$, having a tilt angle "$a_i$" in the same direction with respect to a plane $P_i$ transverse to the axis X. Individual loops in each coil row are shown at different positions along the axis X for purposes of clarity. The illustrated loops of different coil rows shown in FIG. 12C are each configured to provide a main dipole field, but it is to be understood that other embodiments may incorporate multiple multipole configurations within individual coil rows or among different coil rows. In one embodiment the coil rows of the magnet 30 may have essentially the same helical configuration in accord with the X( ) equation, i.e., $a_1=a_2=a_3$. In other embodiments the individual coil rows can be designed to provide different performance features and can be independently controlled. For example, the tilt angles $a_i$ may differ from row to row to develop variations in proportions of axial and transverse field strength. As shown in FIG. 12C this may be effected by separately connecting the different coil rows to different power supplies $PS_i$ for independent control. In another design the magnet 30 may comprise multiple groups of coil rows wherein each group is connected to a separate power supply. In these embodiments the power supplies can be controlled to proportion the relative field strength of the magnet 30. This not only contemplates proportioning axial and transverse field strengths, but also relative strengths of different multipole orders. In other embodiments of coil assemblies formed with multiple coil rows (including but not limited to double helix configurations) it is also advantageous to separately control individual coil rows or groups of coil rows. For example, in a particle beam application, changing the focusing capability in a magnet assembly can be effected by modifying the current supplied to different winding configurations, e.g., dipole and quadrupole.

The multipole content of a given coil geometry is strongly affected by the symmetry of the winding configuration. In the ends of a single-layer helical winding, such as the illustrated row 32, the up-down symmetry is broken because all of the tilts in different rows are in the same direction. In double helix embodiments the asymmetry of each coil row is countered by another coil row with the formation of coil pairs having equal but opposing tilt angles. For the magnet 30 having a dipole field as the main component, if left uncompensated, this asymmetry would introduce higher-order multipole fields near the ends of the coil. As can be seen from Table 5, even in the center of the coil, about 3 coil aperture diameters away from the ends, a significant quadrupole field $B_2$ is present relative to the double-helix coil magnet 16 of FIG. 11. A comparison with Table 1d, which illustrates field components for the same coil geometry, but with the two rows 18A and 18B (providing a double helix configuration wherein coils in the pair have opposing tilt angles), shows this effect. However, by applying an optimization procedure such as described in FIG. 10 for the bent coil of FIG. 8, the higher-order fields can be minimized for magnets formed with a straight helical coil row such as the row 32. In other embodiments the coil rows may be formed along a curved axis. In this example of a straight geometry, the procedure of FIG. 10 is modified to not include the step of performing the bending transformation. The results of this optimization for the straight geometry coil magnet 30 are shown in Table 6, where again only the quadrupole, sextupole and octupole components have been optimized. The multiplication factors obtained from the optimization are given in Table 7. As a result of performing the optimization, modulations are introduced into one or more coil rows to offset the magnitudes of higher order field components associated with each of the coil rows 32. For example, the quadrupole field $B_2$ is reduced to a value less than $10^{-9}$ that of the main filed dipole component. Other components which were simultaneously optimized exhibit similar reductions in field strength. The calculations confirm that helical coil rows having high quality fields can be constructed without a double helix configuration as described in the '042 patent. Such magnet designs can provide an axial field in combination with a high quality transverse field, e.g., in particle beam accelerators. The same concepts can be applied in applications of beam bending and focusing. The main field component may be a quadrupole field or an even higher order field. Field quality may be determined as described for other embodiments, based on multipole content in a circle along a plave transverse to the axis.

TABLE 5

Multipole content of a straight single layer coil in center of winding. In comparison to the double-layer coil (see Table 1d) an increased quadrupole component $B_2$ is introduced. The coil current has been adjusted to 472 A generating a dipole field of 1000 Gauss.

| MP Order | An | Bn | Cn |
| --- | --- | --- | --- |
| 1 | 2.02E−03 | 1.00E+03 | 1.00E+03 |
| 2 | −1.13E−03 | −1.88E−02 | 1.88E−02 |
| 3 | −3.42E−05 | −1.76E−03 | 1.76E−03 |
| 4 | −2.01E−06 | 1.65E−03 | 1.65E−03 |
| 5 | 7.55E−07 | −1.67E−03 | 1.67E−03 |
| 6 | 4.44E−07 | 8.87E−04 | 8.87E−04 |
| 7 | 2.69E−06 | 9.89E−04 | 9.89E−04 |
| 8 | 2.02E−06 | −2.19E−03 | 2.19E−03 |
| 9 | −5.05E−06 | −6.34E−04 | 6.34E−04 |
| 10 | −2.30E−06 | 3.05E−03 | 3.05E−03 |

Optimizing Multipole Fields in Single-Layer Straight Coil

TABLE 6

The multipole content of the straight, single-layer coil at a reference radius of 20 mm (80% of coil aperture) after optimization of quadrupole, sextupole and octupole components. The current remained at 472 A. In particular the quadrupole field component B2 has been significantly reduced. Compare to Table 5.

| MP Order | An | Bn | Cn |
| --- | --- | --- | --- |
| 1 | 2.02E−03 | 1.00E+03 | 1.00E+03 |
| 2 | −1.85E−06 | 2.94E−07 | 1.87E−06 |
| 3 | −4.16E−05 | −2.72E−07 | 4.16E−05 |
| 4 | 4.15E−05 | 9.26E−07 | 4.15E−05 |
| 5 | 7.46E−07 | −1.36E−03 | 1.36E−03 |
| 6 | −8.27E−08 | 8.85E−04 | 8.85E−04 |
| 7 | 2.71E−06 | 6.67E−04 | 6.67E−04 |
| 8 | 2.48E−06 | −2.20E−03 | 2.20E−03 |
| 9 | −5.10E−06 | −9.70E−04 | 9.70E−04 |
| 10 | −2.56E−06 | 3.04E−03 | 3.04E−03 |

TABLE 7

Optimized amplitude factors and phase angles for straight, single-layer coil.

| | $\epsilon_n$ | $\Delta\phi_n$ |
| --- | --- | --- |
| $\epsilon_2 \sin(2\theta + \Delta\phi_2)$ | 1.189359E−05 | 5.999469E−02 |
| $\epsilon_3 \sin(3\theta + \Delta\phi_3)$ | 8.332971E−07 | −4.671344E−03 |
| $\epsilon_4 \sin(4\theta + \Delta\phi_4)$ | −8.235957E−07 | −2.583852E−02 |

Figure 16A:
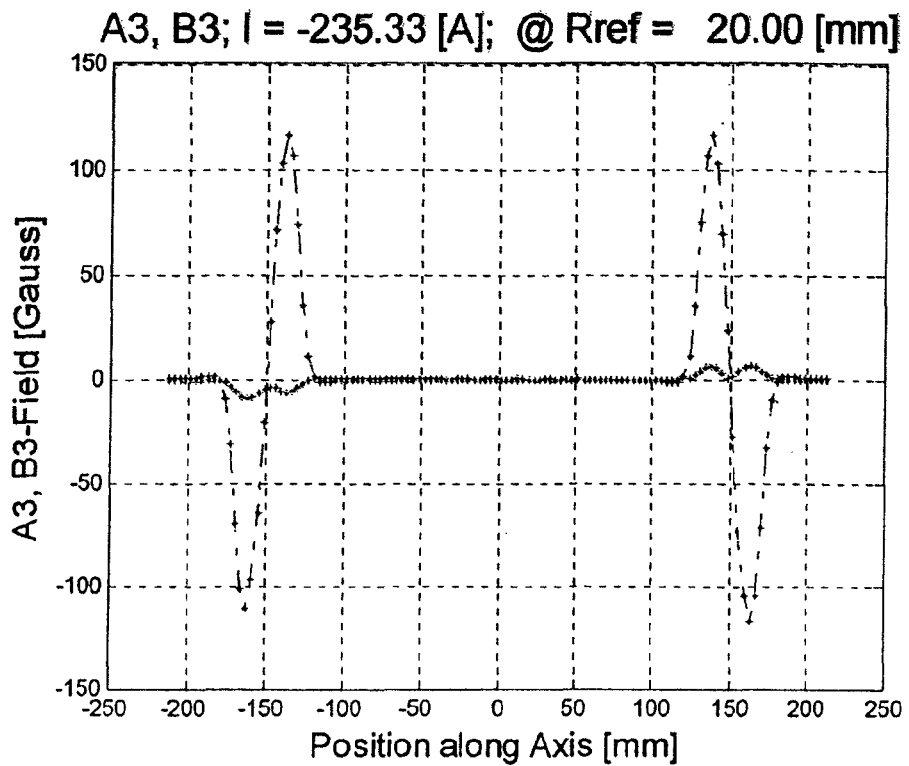
FIGS. 16A and 16B illustrate sextupole field magnitudes along a central axis of the coil assembly shown in FIG. 11.

As shown above for the double helix coil magnet 16 of FIG. 11, higher-order multipole fields are highly suppressed in the center of double-helix coils at a distance from the coil ends of 2 to 3 times the coil aperture. The 300 mm magnet 16 has for the inner row 18A first and second coil ends 22A and 22B, and has for the outer coil row 18B first and second coil ends 22C and 22D. With reference to FIG. 16A, at positions approaching the coil ends (+/−150 mm) the higher-order terms rise significantly beginning at about 50 mm (or approximately one aperture diameter) from the coil ends, reaching a maximum value and finally decreasing to zero, typically within one aperture diameter beyond the coil ends. For most applications performance specifications are based on relative magnitudes of components, such as by performing an integration of each higher order multipole field over the full length of the magnet and comparing the value to that of the main field component. This way a determination is made as to whether the higher-order multipole fields, resulting from the coil ends, are acceptable.

According to embodiments of the invention, higher field uniformity is achievable over the full axial length of the magnet coil and, specifically, in regions within one aperture diameter of the coil ends. A first design providing this improved field quality is based on introduction of variable aperture and coil row diameters along the magnet axis, e.g., within one aperture diameter of each coil end of a coil row.

The term flared region as used to describe such embodiments means a geometry which includes a curved contour extending radially outward from the axis around which a helical conductor pattern extends, and varying in distance from the axis as a function of position along the axis. In example embodiments the curved contour is symmetric about the axis but the invention is not so limited.

Figure 17A:
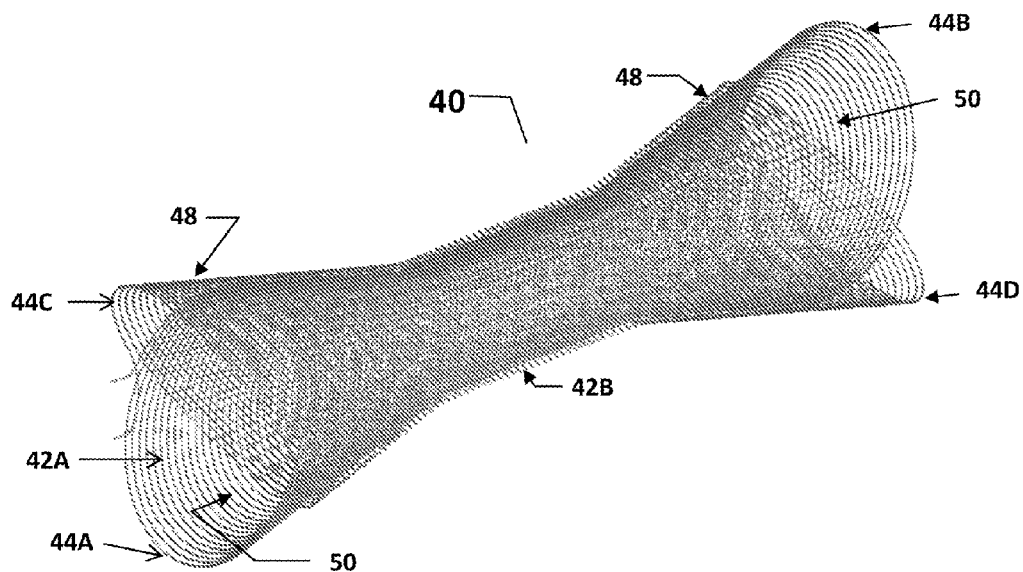
FIGS. 17A and 17B illustrate a coil assembly according to another embodiment of the invention in perspective and elevation views, respectively.
Figure 17B:
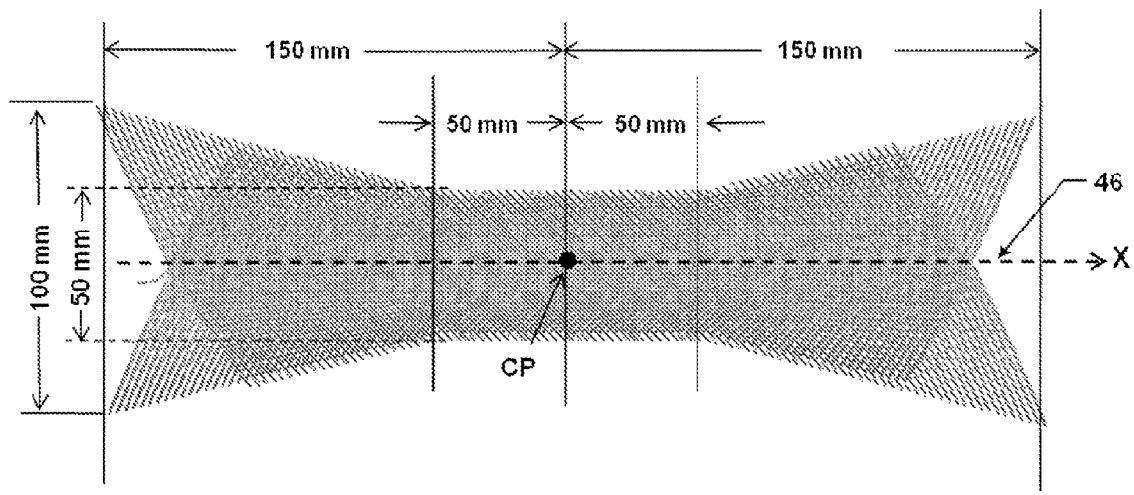

FIG. 17A shows a coil assembly 40, which is a modification of the coil magnet 16 wherein each of two coil rows, inner coil row 42A and outer coil row 42B, together form a double helix coil. The coil rows 42A and 42B each include a flared region 48 along each of the coil ends. The inner coil row 42A has opposing coil ends 44A and 44B while the outer coil row 42B has opposing coil ends 44C and 44D. The coil rows otherwise conform to the geometry described for the coil rows 18A and 18B of FIG. 11. That is, there are 100 turns in each coil row and along the inner portions of the axis (i.e., more than one 100 mm aperture diameter from each coil end) the aperture radius is 25 mm and the radius of the outer coil 42B is 27 mm. FIG. 17B is an elevation view of the coil assembly 40 illustrating positioning about a central, symmetric axis 46.

As shown in FIG. 17, within 100 mm from each coil end 44A and 44B, the coil aperture radius (also corresponding to the radius of the inner coil row 42A) increases monotonically. In a center region extending inward 100 mm from each coil end 44A and 44B, both the coil aperture radius and the radius of the inner coil row 42A are 25 mm, corresponding to a 50 mm diameter. Within 100 mm from each coil end 44C and 44D, the radius of the outer coil row 42B increases monotonically. At 100 mm from each coil end 44C and 44D, the radius of the outer coil row 42B is 25 mm. At the coil ends (44A, 44C) and (44B, 44D), the aperture radius increases to about 50 mm or about a 100 mm diameter. at the coil ends. The radius of the outer coil row 42B increases monotonically from a 27 mm radius (54 mm diameter) to a 54 mm aperture radius (108 mm diameter) at the coil ends. In other embodiments, the assembly may include a central flared section of variable aperture (or coil) radius formed between sections of constant aperture (or coil row) radius. See, for example, the sections 355, 360 and 370 of magent assembly 300 shown in FIG. 23.

The manufacturing technology described in Ser. No. 12/061,813 enables fabrication of flared regions 48 resulting in flared apertures 50. Also as described therein, precise support grooves are machined into a support structure, in which the conductor is placed. The machining process for the changing aperture is similar to what is performed for manufacturing of bent coils as described with reference to FIGS. 13 and 15.

Generally, for fabrication of magnets in accord with the flared geometry of FIG. 17 a core is formed from a mold, over which a fiber reinforced composite lay-up is formed to create a substrate in which grooves for receiving coil can be formed. The core includes a slope corresponding to the desired slope of the flared regions 48 and the core may be removed after the composite lay-up is cured and machined. The core may be removed with a solvent, e.g., water, or chemically. It is to be understood that multiple layers can be formed one over another to create multiple double helix configurations or single helix configurations (see FIG. 12) which may also incorporate flared end regions 48. That is, a series of resinous composite layers are sequentially formed over one another with the intervening coils placed in grooves machined along each layer surface. See again Ser. No. 12/061,813.

The coil rows 42A and 42B each depart from a straight cylindrical pattern of constant radius (e.g., 25 mm or 27 mm) beginning at a displacement of +/−50 mm from the center point CP along the axis 46. The flared regions 48 of the coil rows may have, as illustrated, an abrupt transition to a linear slope of 0.25 at +/−50 mm, or may be formed with a gradual continuous transition to the constant slope. The resulting aperture radius at each coil end is 50 mm. Alternately, the flare may follow a quadratic slope (not illustrated) and other slopes may also be followed to provide an optimum reduction in end field effects within the original aperture radius. By providing a non-linear slope it is possible to create a more abrupt decrease in the main field, e.g., dipole, component while also suppressing the higher order components which normally persist near the coil ends.

Figure 16B:
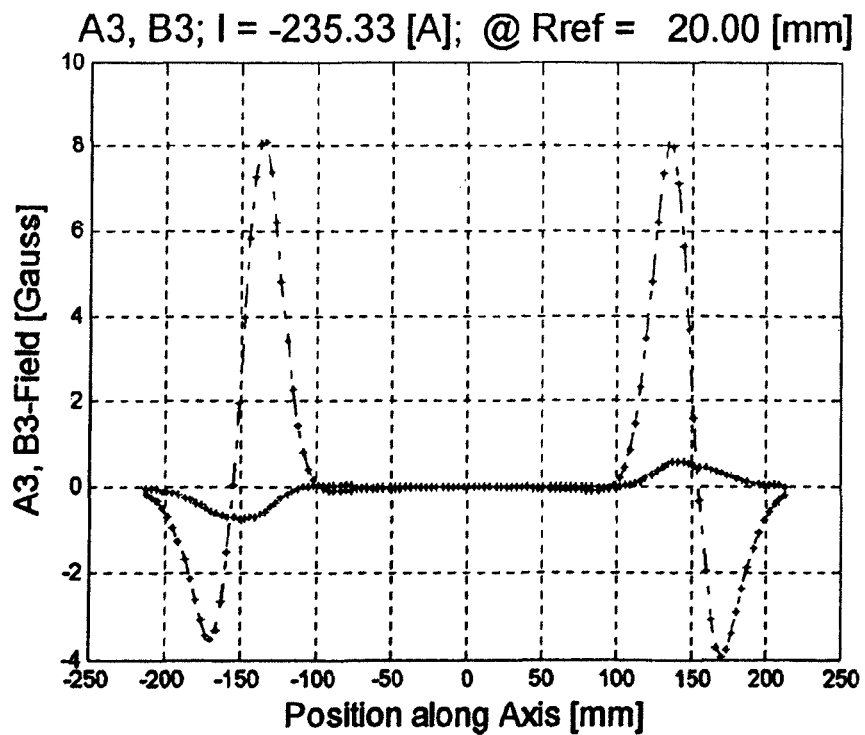

To illustrate improvements achievable by incorporating flared coil end regions 48 such as shown in FIG. 17, FIG. 16A illustrates the sextupole component which is prevalent for the straight geometry configuration of the magnet 16 shown in FIG. 11. Notably at a reference radius of 20 mm there are peak sextupole components at about 125 mm and 175 mm from the center point CP of the magnet 16. FIG. 16B illustrates the suppressed sextupole component realized at these same positions when the magnet 16 is modified to incorporate flared end regions 48 according to FIG. 17. That is, for the magnet 40, the peak sextupole components near the coil ends, i.e., at about 125 mm and 175 mm from the center point CP', diminish by more than a factor of 10. For higher order multipole terms the flare provides even greater suppression about the coil ends. See Tables 8A and 8B which provide values of several different multipole components in a plane transverse to the axis. Table 8A provides the field values at +125 mm from the center point CP of the magnet 16, i.e., per FIGS. 11 and 16A. Table 8B provides the field values at 125 mm from the center point CP' of the magnet 40, i.e., per FIGS. 17 and 16B. Table 8C illustrates that with incorporation of flared aperture geometries of FIG. 17 the field at the center point CP' of the magnet 40 is not degraded. With the main field being a dipole field, the flared end reduces the higher order sextupole field component to a relatively small value. When the main field component is a quadrupole field, the flare reduces the higher order field components to relatively small values as well.

TABLE 8A

Straight Ends

| MP Order | An | Bn | Cn |
| --- | --- | --- | --- |
| 1 | −2.96E+00 | 9.23E+02 | 9.23E+02 |
| 2 | 1.76E+01 | −7.49E−01 | 1.77E+01 |
| 3 | 6.37E+00 | 1.11E+02 | 1.12E+02 |
| 4 | 1.83E+01 | −1.78E+00 | 1.84E+01 |
| 5 | 7.57E−01 | 5.27E+00 | 5.32E+00 |
| 6 | 2.29E+00 | −4.68E−01 | 2.34E+00 |
| 7 | −1.14E+00 | −7.87E+00 | 7.96E+00 |
| 8 | −3.18E+00 | 5.16E−01 | 3.22E+00 |
| 9 | −3.79E−01 | −1.83E+00 | 1.87E+00 |
| 10 | −1.42E+00 | 3.41E−01 | 1.46E+00 |

TABLE 8B

Flared Ends

| MP Order | An | Bn | Cn |
| --- | --- | --- | --- |
| 1 | −1.84E+00 | 4.62E+02 | 4.62E+02 |
| 2 | 4.20E+00 | −1.79E−01 | 4.20E+00 |
| 3 | 5.33E−01 | 8.08E+00 | 8.10E+00 |
| 4 | 2.16E−01 | −3.79E−02 | 2.19E−01 |
| 5 | 3.10E−02 | 8.88E−02 | 9.40E−02 |

TABLE 8B-continued

Flared Ends

| MP Order | An | Bn | Cn |
| --- | --- | --- | --- |
| 6 | 7.74E−05 | −3.28E−03 | 3.28E−03 |
| 7 | 7.83E−04 | −1.04E−02 | 1.05E−02 |
| 8 | −3.10E−04 | −3.30E−04 | 4.53E−04 |
| 9 | 9.98E−05 | −6.02E−04 | 6.10E−04 |
| 10 | 4.73E−05 | −5.79E−05 | 7.47E−05 |

TABLE 8C

Multipole content of straight coil with flared end. No significant effect on multipole fields in the center of the coil which is 3 coil apertures away from both ends. Multipole fields in the center of the coil in axial directions. Current adjusted to 238 A generating a dipole field of 1000 Gauss. The table shows high field uniformity in the coil center, where all higher order fields are less or equal to a few per mille relative to the main dipole field.
Flared Ends --- Center of Coil

| MP Order | An | Bn | Cn |
| --- | --- | --- | --- |
| 1 | 1.15E−01 | 1.00E+03 | 1.00E+03 |
| 2 | −8.64E−03 | −2.53E−03 | 9.00E−03 |
| 3 | −7.80E−05 | −2.05E−03 | 2.05E−03 |
| 4 | 1.43E−05 | 8.31E−04 | 8.31E−04 |
| 5 | 8.59E−07 | −8.41E−04 | 8.41E−04 |
| 6 | −4.74E−07 | 4.47E−04 | 4.47E−04 |
| 7 | 5.68E−08 | 4.98E−04 | 4.98E−04 |
| 8 | 1.78E−08 | −1.11E−03 | 1.11E−03 |
| 9 | −1.54E−10 | −3.17E−04 | 3.17E−04 |
| 10 | −6.35E−10 | 1.54E−03 | 1.54E−03 |

Another embodiment for improving the field uniformity in the coil ends is based on the optimization procedure shown for bent coils. The iterative optimization process is described in FIG. 19. This procedure is a generalization of the algorithms applicable to the bent geometry of FIG. 8 and the straight coil of FIG. 12. The amplitude factors $\in_n$ are no longer constant but have to be adjusted depending on the axial position and therefore depend on the azimuth angle θ. To accommodate this axial dependence, the $\in_n$ values become functions of the angle θ. In one embodiment of the procedure each multiplication factor $\in_n$ can be described as a power series and is then given by typically 2 to 4 parameters as shown in the following equation.

$$\varepsilon_n = \sum_{m=0}^{mmax} a_m \theta^m = a_0 + a_1 \cdot \theta + a_2 \cdot \theta^2 + \ldots$$

Figure 19:
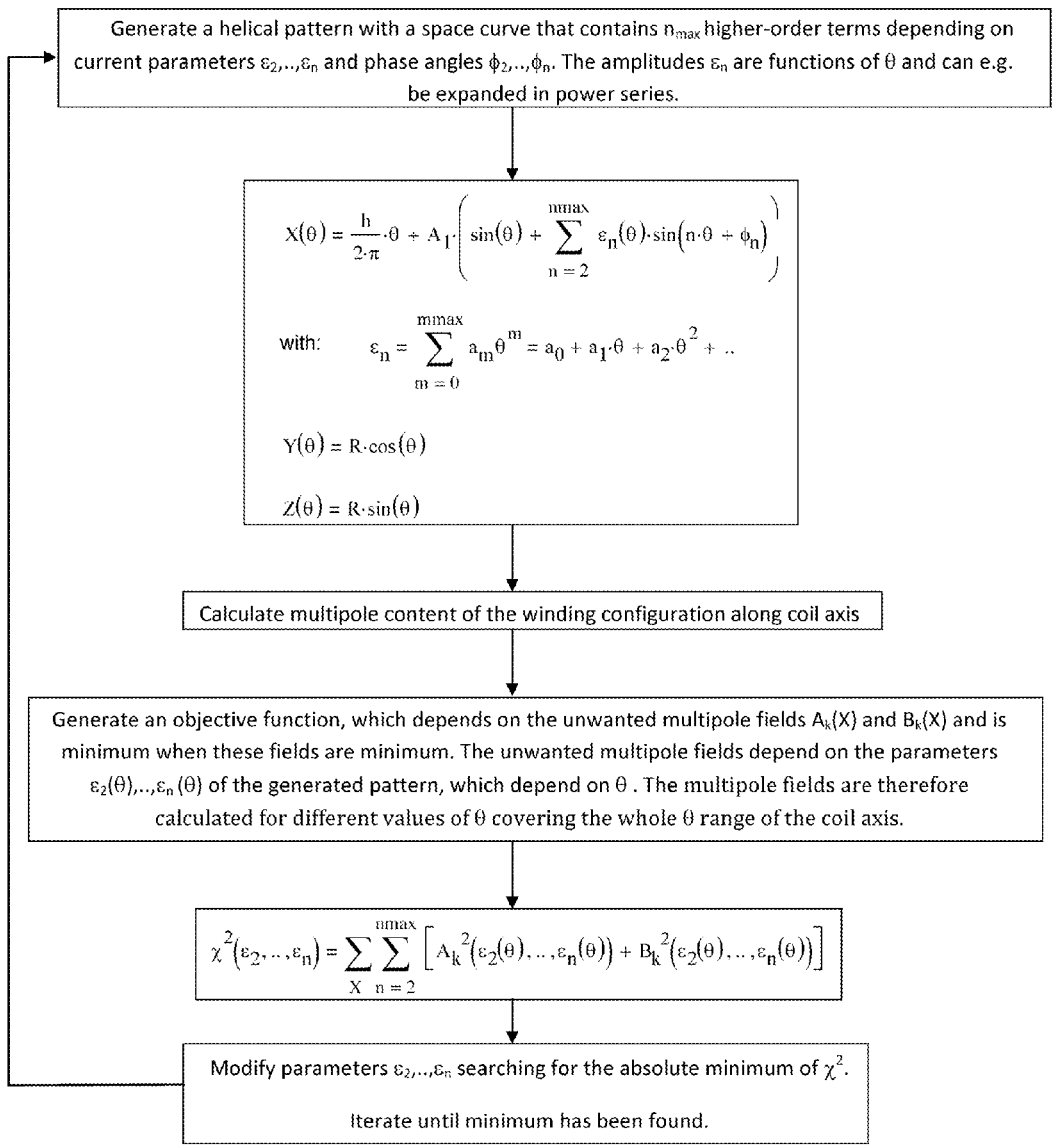

The number of parameters that need to be optimized increases, but the iterative optimization is performed in the same way. A complete representation of the applicable algorithm is shown in FIG. 19. With the algorithm modulation components are determined which when added to the X(θ) function, reduce the higher order multipole field components (e.g., the sextupole component shown in FIG. 16A). As discussed for embodiments which incorporate flared coil end regions, embodiments which suppress higher order multipoloes near the coil ends in accord with an optimization process, generally reduce the undesired orders by a factor of 102 or more relative to the main field component. When the main field component is a dipole field, the unmodified end field has a significant asextupole component; and when the main field component is a quadrupole field, the unmodified end field includes one or more significant higher order components.

Embodiments of the invention may be fabricated in accord with a design referred to as a Direct Helix (DH) Design and a process referred to as a Direct Helix (DH) Process. The Direct Helix Process enables one to directly create a continuous conductor path along a tubular shaped structure having a conductive outer surface. The tubular shaped structure may be in the shape of a regular cylinder or may take a non-linear shape including the shapes illustrated in various ones of the figures, including curved geometries along a curved axis and apertures having varied radii. In one series of embodiments, a continuous helically-shaped conductor has varying material widths (measurable across cross sections taken along planes transverse to the conductor path) which can reduce the total resistance of the conductor while still maintaining desired magnetic field characteristics. The conductor cross sections can be adjusted and optimized to provide desired field characteristics and electrical properties. The conductive outer surface may be a layer formed on a tubular substrate or may be the surface of a solid, monolithic conductive tube formed, for example, of extruded copper or may be a metallic casting. The thickness of the outer conductor surface is not limited and certainly can range at least from microns to multiple centimeters.

The examples of design and manufacturing methods now described involve an electrically conducting tube positioned about a substrate and machining away portions of the conducting tube to leave a continuous conductor path. The path may be in the form of a tilted helix formed along the shape of a regular cylinder, but other multipoles and combinations of multipoles are contemplated. In multi-layer coil embodiments, for each layer or coil row, the conductive coil pattern is formed along a surface that may be bonded or otherwise attached to a layer of insulator which may provide the function of a stabilizing substrate.

Generally, a desired conductor profile is formed in a tubular surface by any of numerous known techniques such as machining with a tool, etching or laser cutting. All conductive material in electrical contact with the conductive surface, in regions outside of the defined conductor path, is removed, leaving a void which may simply provide a spatial gap between loops of the coil, or which may be filled with suitable dielectric material. In some embodiments, the voids can be filled with epoxy to provide a desired mechanical strength and dielectric property or may be used as one or more cooling channels, e.g., for flow of water or liquid nitrogen along the surface of the conductor. The coolant may be in direct contact with each conductor. Further, the level of cooling can be improved by introducing gaps between conductor layers. This reduces coolant flow resistance and more heat can be removed.

Embodiments of the invention may incorporate double helix winding configurations based in part on concepts described in the '042 patent, but winding geometries may vary from turn-to-turn and from layer-to-layer to achieve desired field configurations and field quality characteristics analogous relative to those having been provided with prior-known "wire" wound coils. A larger number of choices of conductive materials are now conceivable with embodiments of the invention, these including copper, aluminum and numerous types of superconducting materials. Very robust coil windings are made available. Generally, many conductive materials that do not lend themselves to conventional wire manufacture are available to practice the present invention. For example, the invention allows the use of superconducting materials in thin sheets or tube shapes. In other embodiments high temperature superconductors like YBCO can be used in the invented process by directly depositing layers of the material on to an appropriate substrate material as used in the manufacturing of tape conductors of the same superconductor. In such applications multi-layered coils can be manufactured with a very small radial build-up, e.g., minimum coil diameter, since the conductor layers of superconductors like YBCO are typically only 1 or 2 microns thick. Such embodiments are useful for high temperature superconductors which are of a brittle nature and having limitations on achievable bending radii.

Also, because the conductive coils may be formed in-situ with a material removal process, the invention allows for accommodation of very "large" conductors, i.e., having large cross sections, without encountering many of the difficulties which might result from conforming a wire into a helical pattern. On the other hand, very small and fine line geometries for coil configurations can be attained via, for example, an etching or laser removal process. Thus embodiments of the invention are well-suited for medical devices and small sensors. Examples include magnetic resonance imaging applications and catheters. Further, the invention allows provision of variable conductor cross section along each turn or loop in a helical pattern to further reduce resistance, or to optimize field shape. The invention is not limited to forming helical coil shapes about an axis of symmetry and may be applied to create numerous conventional geometries along a surface by removal of material. A feature of the invention is enablement of conductive patterns having very small radii of curvature otherwise not attainable with conventional wire winding techniques. Many of the embodiments described herein may be fabricated as Direct Helix designs and the method described in FIG. 15 may be adapted to perform the material removal process.

A Direct Helix manufacturing process begins with provision of an electrically conductive tube or layer that is bonded or deposited onto a support structure. A groove, fully penetrating through the conductive material is cut into the layer such that a conductive path along the surface remains, which forms a winding suitable for generating a magnetic field or which, in the presence of a changing magnetic field, induces a voltage. The groove cut into the conductive material leaves a void or space which electrically isolates adjacent winding turns from one another.

Multi-layered coil configurations are formed by combining such tubes or layers in a concentric configuration with the coil rows insulated from each other, although the conductor forming each coil row may be electrically wired in series to conductor in other rows to create a multi-level magnetic system. That is, coil ends formed along each tube or layer can be connected to coil ends in one or more other tubes such that a continuous conductor path results for the multi-layered structure. In such an embodiment gaps can be introduced between the multitude of tubes, or layers of coil rows, which allow coolant to make contact with multiple sides of the conductor for highly effective removal of heat generated by the conductor.

An example of a coil configuration according to the invention, referred to as Direct Coil, and an associated, exemplary design process is described for a dipole coil. The following description is limited to a single layer coil or coil row, since the process of forming additional layers follows the same procedure. The exemplary Direct Coils are helical in shape and the configuration is referred to herein as a Direct Helix, or DH.

As for conventional coil designs we start with given specifications for the dipole coil. Relevant parameters needed for the design of the dipole coil are shown in Table 9:

TABLE 9

Typical design parameters for a dipole coil

| Parameter | Unit | Value |
| --- | --- | --- |
| Coil aperture radius, R | mm | 50 |
| Coil length | mm | 300 |
| Nominal field strength | Tesla | as high as possible |
| Nominal current | A | as high as possible |
| Field uniformity (relative to Dipole) | | as high as possible |

For a given coil aperture and coil length, it is often desirable to attain the highest possible field strength in a continuous, normal conducting operation. In any magnet coil the achievable field strength is limited by the amount of current that can be applied to the coil without overheating the windings or, in case of superconductors, without exceeding the critical current. For normal conducting coils it is therefore important to have a low resistance and a highly efficient cooling scheme. An initial design is performed based on the specifications for geometric coil dimensions, nominal field strength and field uniformity. With a requirement for a highly uniform transverse field, the coil design may be based on a double-helix coil configuration.

In one embodiment according to the invention, a coil geometry provides a tilted helical winding pattern with features of lower resistance, more efficient cooling and higher achievable field strength. The design of the DH coil may be accomplished as follows:

We start by defining a tool path with the space curve of Equation 2 or Equation 3 along which a router bit with a given diameter cuts a fully penetrating groove, G, into a conductive layer having a tubular shape. In the current example the layer is in the form of a self-supporting aluminum or copper tube, but may be a coating provided on a tube-shaped structure. The inner diameter of this tube is equal to the required coil aperture defined in Table 1. The machined groove provides a space, also referred to as an insulative groove, between the turns of the helical winding pattern that is generated. The width, $W_G$, of the insulative groove, which is the distance between neighboring winding turns, is given by the cutting width, e.g., length or diameter, of the router bit. In the following example, the router bit is of a shape having a characteristic cutting diameter and corresponding cutting radius. Once a helical groove is formed, by removal of conductor material, a helical conductor pattern remains.

Merely cutting a helical groove into a conductor does not result in a sufficient conductor path to create a magnetic coil. As shown in the schematic view of an unrolled coil pattern of FIG. 12, additional machined grooves, labeled "Line-in a", "Line-in b" "Line-out a" and "Line-out b" are needed to form lead-in and lead-out connectors and complete a continuous current path that form current entry and exit terminals to the winding.

Figure 20A:
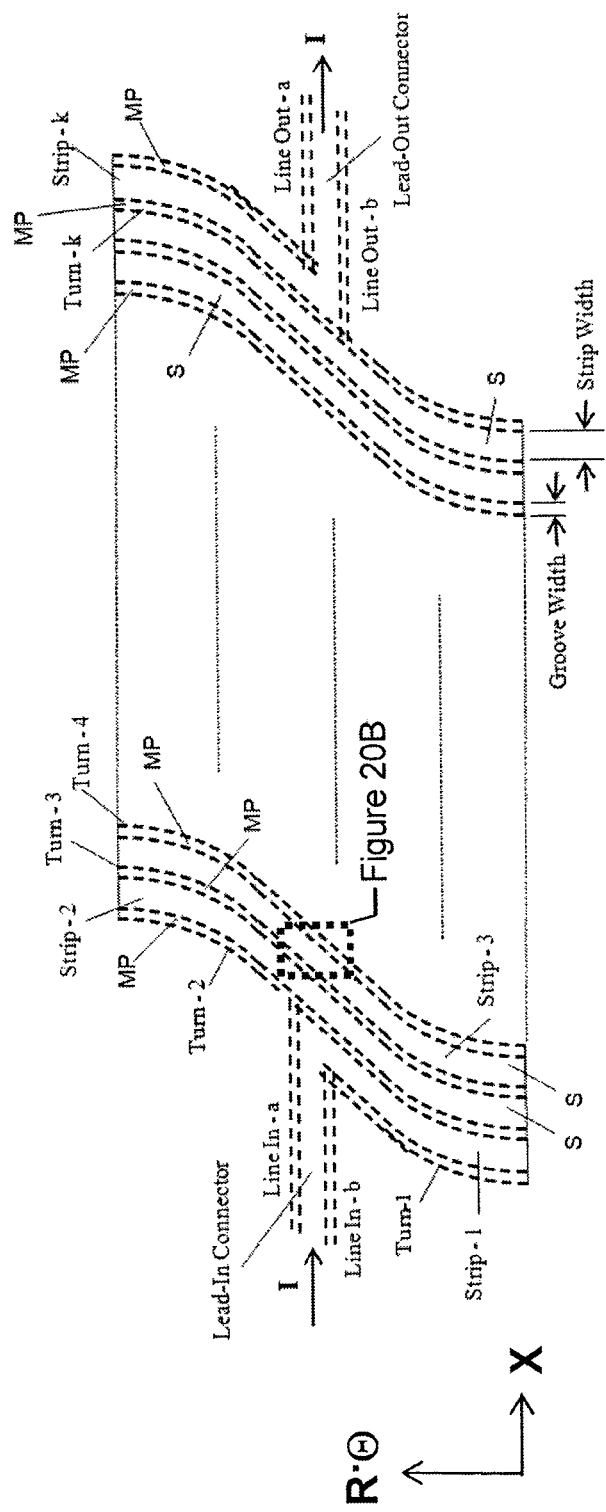
FIG. 20A provides an unrolled view of a coil roll pattern fabricated according to a Direct Helix manufacturing process.

Pairs of dashed lines shown in the unrolled view of FIG. 20A represent outer edges of the router bit machining paths, MP, and the insulative void which results after the conductive material is removed. The remaining strips, S, of conductive material, indicated in FIG. 20A form the resulting helical-shaped conductor path. Of course the paths MP may be formed by other methods such as etching.

To perform a field calculation and to estimate the resistance of the conductive strips, a mathematical description of the strips S is provided. The strips may have relatively large widths, Ws, resulting in a ribbon-like shape of relatively high width-to-thickness ratio, or an approximate rectangular shape with a lower width-to-thickness ratio. As illustrated the strips may be open loops of elliptical shape or may be more complex modulations, and generally, the strip widths may vary as a function of the azimuth angle, θ.

Due to the approximate rectangular shape, in cross section, of the strips, S, it may not be sufficient to calculate the resulting magnetic field using those approximations which have been suitable for a conductor having a circular shape in cross section. In lieu of calculating the resulting magnetic field, e.g., with a single infinitely thin filament that is centrally located within the strip, a more complete design method is provided for both modeling and modifying the pattern of the strips. The method incorporates optimization procedures to achieve desired performance criteria for field uniformity, coil resistance and other parameters of interest.

Figure 21:
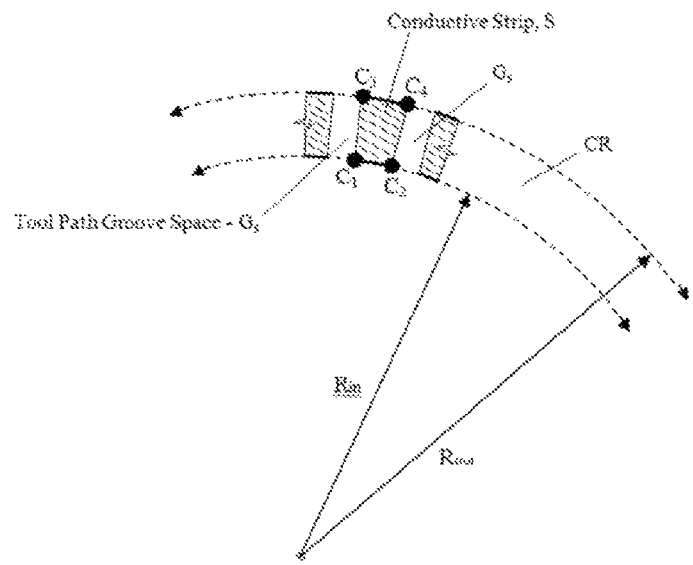
FIG. 21 is a view in cross section of conductive strips in the coil row of FIG. 20.

FIG. 21 illustrates each strip, corresponding to an open, elliptical-shaped loop in the illustrated coil row, CR, may be described by 4 curves, $C_1$, $C_2$, $C_3$, $C_4$, each spatially positioned along one of the corners of a strip S. That is, assuming the strip has significant thickness, two of the curves, $C_1$, $C_2$, are located on an inner cylinder with radius $R_{in}$ and two of the curves $C_3$, $C_4$, are positioned on an outer cylinder with radius $R_{out}$. $R_{in}$ and $R_{out}$ define the inner and outer radii of the conductive layer. In this example, $R_{in}$ corresponds to the aperture radius, R. See FIG. 21 which provides a partial view of the tube in cross section, showing two adjacent groove spaces $G_S$ with a remaining strip S positioned between the groove spaces.

According to one method for modeling the magnetic fields, the geometry of the four curves $C_1$, $C_2$, $C_3$, $C_4$, can be determined by subdividing the helical-shaped groove G, cut into the conductive cylinder, into individual elliptical-shaped groove turns, each having a center path, labeled Turn-1 to Turn-k for the given example. The space curve along the center line of the path for each of these curves is obtainable with Equations 2 or Equations 3. Assuming that the router bit provides a circular cutting shape of diameter $D_{router}$ with a corresponding radius $R_{router}$, the strip corner curves are defined by:

| Strip-1: | left edge: | Turn-1 + $R_{router}$ |
| | right edge: | Turn-2 − $R_{router}$ |
| Strip-2: | left edge: | Turn-2 + $R_{router}$ |
| | right edge: | Turn-3 − $R_{router}$ |
| ... | | |
| Strip-n: | left edge: | Turn-k + $R_{router}$ |
| | right edge: | Turn-k + 1 − $R_{router}$ |

It is important to note, the corner curves $C_1$-$C_4$ of the conductive strips are not determined by imparting a constant shift of plus or minus ½$W_G$ (=$R_{router}$) along the X-axis of the router bit curve. The following procedure outlines a process for calculating points on each of the corner curve space paths. It is noted that with similar procedures, space paths can be calculated for other or additional curves within the conductor strip S to vary the accuracy of the model. The displacement of points relative to individual points along the center of the tool path curve (Equations 2 or Equations 3), to provide the corner curve paths, is determined as now described.

The slope angle at any point along the tool path curve in the unrolled view is given by the following derivative obtained from Equations 2 or Equations 3 and assuming a dipole field:

$$\frac{dX}{du} = \tan(\alpha) = \frac{h}{2 \cdot \pi \cdot R} + \frac{A_1}{R} \cdot \cos\left(\frac{u}{R}\right) \quad \text{Equation 7}$$

with:

$$u = R \cdot \theta$$

From Equation 7 one obtains the slope angle α as a function of u or θ:

$$\alpha(\theta) = \tan^{-1}\left(\frac{h}{2 \cdot \pi \cdot R} + \frac{A_1}{R} \cdot \cos\left(\frac{u}{R}\right)\right) \quad \text{Equation 8}$$
$$= \tan^{-1}\left(\frac{h}{2 \cdot \pi \cdot R} + \frac{A_1}{R} \cdot \cos(\theta)\right)$$

The resulting displacement in X-direction with a router radius of $R_{router}$ for any point along the tool path curve is the given by:

$$\Delta X(\theta) = \frac{R_{router}}{\sin(\alpha)} \quad \text{Equation 9}$$

The field calculations of the coil are based on the four corner curves $C_1$-$C_4$ that define the conductive strips. The tool path is approximated by closely spaced points along the tool path curve. Each of these points is then shifted to the right or left by ±ΔX(θ) to obtain the corresponding point on the strip corner curve. Applying the superposition principle for magnetic fields the Biot-Savart Law is then used to calculate the field resulting from each of the four corner strip curves.

The unique geometry of the conductive strips in DH coils leads to an overall resistance of the coil that cannot be achieved with conventional coil geometries. Since DH coils also offer highly efficient cooling of the conductor, normal conducting DH coils can achieve fields that are not possible with conventional coil windings.

With in-situ "machining" to define the conductor, the use of conductor materials, which would be impossible with conventional winding techniques, becomes feasible. In particular, high temperature superconductors, which are brittle, can be applied to provide coils with unprecedented performance.

Figure 22:
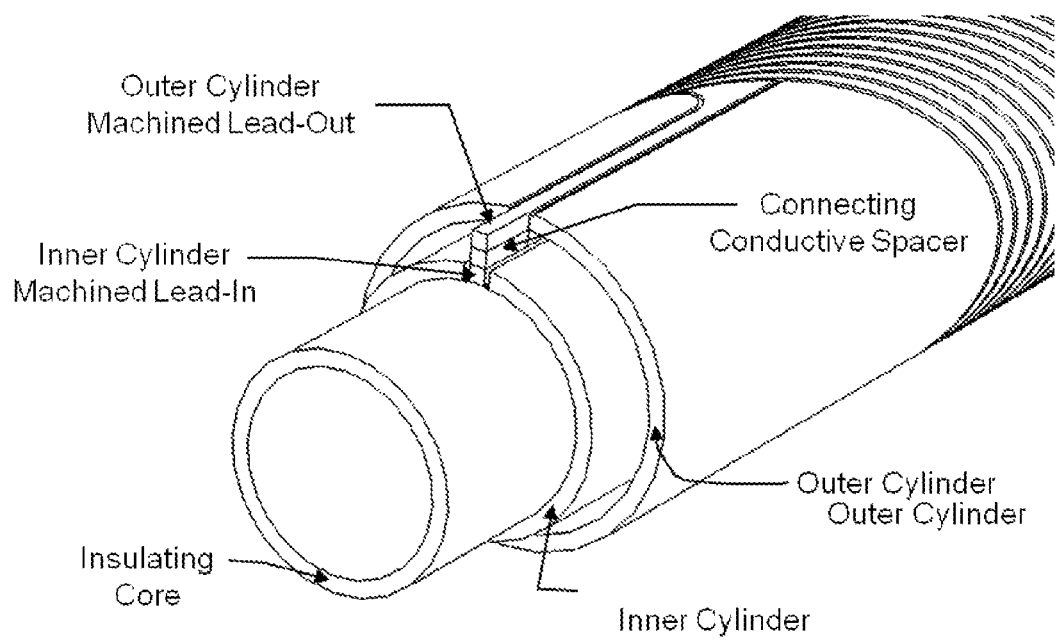
FIG. 22 is a perspective view illustrating features of a Direct Helix coil.

An exemplary coil design based on the double helix technology is shown in FIG. 22 which shows a coil consisting of two concentric cylinders. At both ends the machined groove departs from the coil row pattern, continuing without interruption in an axial direction toward an end of the aluminum cylinder. See segments "Line In-b" or "Line Out-a" of FIG. 20.

Figure 20B:
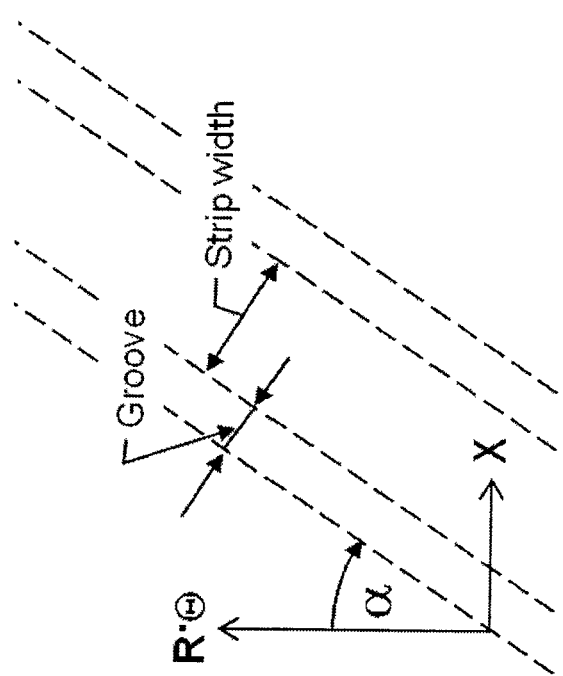
FIG. 20B is a partial unrolled view of conductive strips shown in FIG. 20A.

As also described in FIG. 20, additional groove segments, "Line In-a", "Line Out-b", are then machined, one at each end, to complete the pattern. These additional groove segments "Line In-a", "Line Out-b" each run alongside one of the groove segments "Line In-b" or "Line Out-a" from the end of the aluminum cylinder until they meet the coil pattern. The combination of segments "Line In-a, Line In-b" and "Line Out-a, Line Out-b" complete the formation of a "Lead-in connector (for bringing current into the coil row) and a Lead-out connector for taking current out from the coil row, e.g., to another coil row that has been machined in a concentrically positioned cylinder.

For many applications several concentric cylinders are necessary for a DH coil to generate the required field configuration. The example of FIG. 22 illustrates two concentric cylinders, but the number of tubes is not limited and concentric tubes having different diameters but the same radius of curvature can be so formed. The Figure shows the Lead-in and Lead-out connectors associated with the two cylinders, configured so that the connectors can be coupled together. In order to form a continuous winding pattern out of two or more coil rows among concentric tubes (straight or curved), the Lead-in and Lead-out connectors extending out from the coil patterns are interconnected. For example, a small piece of conductive material (e.g., a conductive spacer) may be soldered between the lead connectors of the two cylinders at one end to make the current connection as shown in FIG. 22. The two connectors at the other end of the tube pair then form the input and output leads for the two-layer coil.

As noted, the processes illustrated in FIGS. 15A-15C are applicable to a variety of coil row designs, including embodiments incorporating the Direct Helix design. For manufacturing processes such as illustrated in FIG. 13, the machining process can minimize manufacturing error and further correction resulting from manufacturing tolerances can be offset by measuring multifield components during manufacture and incorporating offsetting modulations in subsequent coil rows. However, to the extent a coil row design, such a Direct Helix design includes systematic, non-random errors, the process of applying corrections to outer coils can offset undesired multifield components generated by inner coil rows.

Although example Direct Helix embodiments have been described, numerous other designs and methods of manufacture are contemplated. For example, the aforedescribed cylinders in which helical grooves are formed may have an outer insulative surface (such as an anodization, a deposited coating or other material) under which the conductive layer resides. The insulative surface may be formed prior to or after the groove is formed in the shape.

Figure 23:
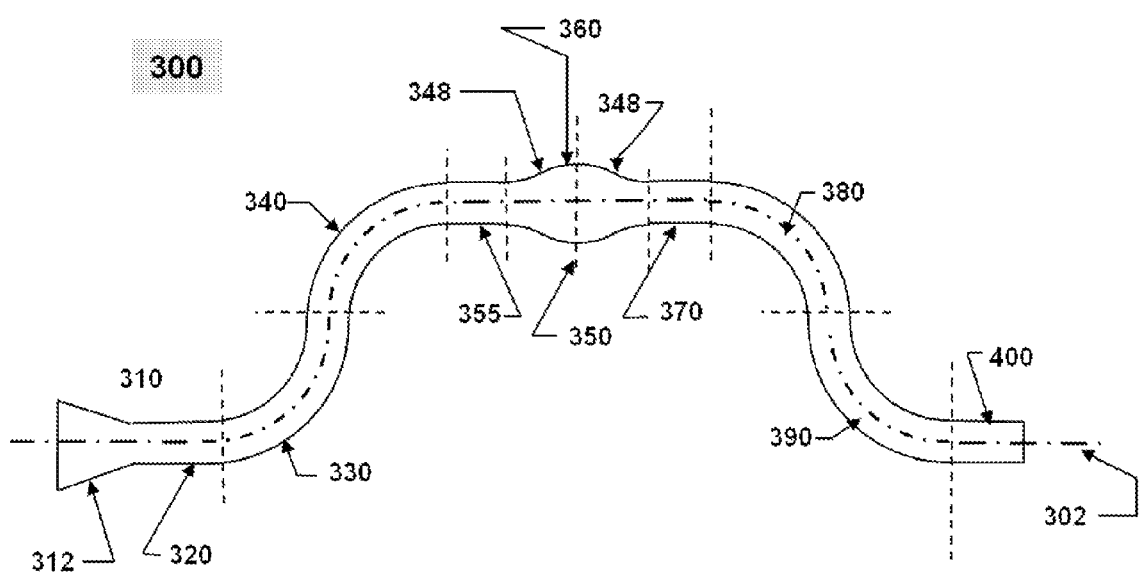
FIG. 23 is a schematic view of a magnet assembly comprising coil sections of varied design according to the invention.

FIG. 23 illustrates a magnet assembly 300 formed along a central axis 302, comprising an exemplary combination of interconnected coil assemblies according to the invention. In this example multiple straight sections (320, 355, 370 and 400) are designed to provide a main field quadrupole component and multiple curvilinear segments (330, 340, 380 and 390) are configured to provide dipole main fields to bend a charged particle beam according to the shape of each respective segment. The illustrated curvilinear segments may be combined function magnets wherein a dipole field is superimposed on a main dipole field. An end segment coil assembly 310, includes a flared aperture region 312 in combination with a straight portion 320 integrally formed in the same coil rows. The assembly 300 is connected to the section 330 having a curved shape. The section 330 is connected to the section 340 also having a curved shape. The section 350 comprises a central flared section 360 positioned between two adjoining straight sections 355 and 370. The section 350 is interposed between the section 340 and the section 380 also having curved shape. Still another section 390 having a curved shape is interposed between the section 380 and a straight end section 400. The section 400 has an aperture region of constant diameter and has been designed according to the optimization process of FIG. 19. In numerous embodiments the straight sections may be designed to generate quadrupole fields (for focusing) or fields of higher order (for beam optical corrections), and the sections having curved shapes may generate pure dipole fields alone or in combination with higher order fields. The individual sections may comprise single helix or double helix coil rows.

Further, the combined function capabilities may be imparted by generating multiple modulation components in individual coil rows or by forming, e.g., concentrically about one another, a series of coil rows that each generate main field components of different orders. The straight sections, e.g., 355, 370, may alternately be drift regions of variable cross sections. The flared section 360 is essentially the geometry of two flared regions 48 positioned end-to-end forming a balloon-like profile suitable for imparting, for example, high quality focusing fields. That is, as described for the flared regions 48, the field quality in the flared region section 360 at a given distance R from the central axis 302 exhibits is relatively high (e.g., pure quadrupole) compared to straight sections of smaller (e.g., 50 percent) aperture diameter. Alternately, any of the straight or flared region sections could be drift regions (having no fields generated therein).

Another consideration when constructing complex geometries for magnet assemblies is the continual need for focusing the charged particle beam. Typically this has been accomplished by assembling straight sections that generate quadrupole fields for focusing the beam with other functions such as dipole fields suitable for bending. A feature of the invention is integration of these functions which in the past have required multiple sections for focusing in combination with sections for beam bending. Conventional quadrupole magnets have a field vector pointing in one direction over the whole length of the magnet. such that when the quadrupole field is applied to focus a beam along a horizontal direction, it simultaneously defocuses the beam in a vertical direction. Similarly, when the quadrupole field focuses the beam along the vertical direction, it simultaneously defocuses the beam in the horizontal direction. For beam optical applications, where net focusing is needed in all directions it has therefore been necessary to use pairs of conventional quadrupole magnets to achieve net focusing in all directions.

Another feature of the invention is construction of a magnet capable of generating, alone or in combination with other multipole orders, a quadrupole field that focuses in all directions. Using the double and single helix concepts described herein, a coil design can be constructed which, for example, rotates the quadrupole field about the central axis as a function of position along the axis. As a result, over the length of the magnet axis, the magnet focuses in all directions. This can be achieved by "twisting" the straight quadrupole coil, as described by Equation 10, around the central coil axis which extends in the X direction.

$$X(\theta) = \frac{h}{2 \cdot \pi} \cdot \theta + \sum_{n=1}^{nmax} A_2 \cdot \sin(2 \cdot \theta)$$ Equation 10

$$Y(\theta) = R \cdot \cos(\theta)$$

$$Z(\theta) = R \cdot \sin(\theta)$$

"Twisting" in this context means that a transformation of the points describing the conductor path in the coil is performed that rotates each point of the pattern in the Y-Z plane by an angle $\Phi_{twist}$ which is proportional to the distance of the point from the origin X=0. This transformation is given by the following equations.

$$\Phi_{twist} = X^* \Delta \phi$$

with $\Delta \phi$ a twist angle in degree per mm advance of X $$X' = X$$

Rotation by the angle $\Phi_{twist}$ is given by X' and Y':

$$Y' = Y*\cos(\Phi_{twist}) + Z*\sin(\Phi_{twist})$$

and $$Z' = -Y*\sin(\Phi_{twist}) + Z*\cos(\Phi_{twist})$$

For example, if a winding pattern has a total length of 360 mm and the total desired twist is 360 degrees, the required twist angle Δφ per mm is one degree.

The resulting winding pattern generates a quadrupole field with a field vector which continuously changes direction along the axis of the magnet. Such a field will simultaneously focus the beam in all directions. Nonlinear functions are also contemplated. That is, the twist angle per mm may vary as a function of angle or as a function of position along the axis. Such a nonuniform twist rate may be useful in performing corrections or modifying the beam shape.

While the invention has been described with reference to particular embodiments, it will be understood by those skilled in the art that various changes may be made and equivalents may be substituted for elements thereof without departing from the scope of the invention. For example, although coils have been shown to be symmetric about a straight or curved axis, numerous ones of the disclosed features can be advantageously applied in other applications such as wherein the axis is generally asymmetric. The scope of the invention is only limited by the claims which follow.

The claimed invention is:

1. A method for manufacture of a completed conductor assembly of the type which, when conducting current, generates a main magnetic field or in which, in the presence of a changing magnetic field, a voltage is induced, the method comprising:
    measuring a deviation of a multipole order from a multipole field specification in one or multiple fully formed coil rows; and
    introducing offsetting corrections during fabrication of an overlying coil row to reduce a deviation from the multipole field specification in the completed assembly.

2. The method of claim 1 wherein the deviation is based on determination of magnitude of a multipole field component.

3. The method of claim 2 wherein the magnitude is determined by measurement of field strength along a circle in a plane passing through the coil rows and performing a Fourier analysis of induced voltage to calculate multipole field content.

4. The method of claim 1 wherein, after reducing the deviation, the associated multipole order is less than $10^{-4}$ that of a main field component.

5. The method of claim 1 wherein the deviation is attributable to manufacturing error.

6. The method of claim 1 wherein the deviation is attributable to actual placement of conductor.

* * * * *